(12) United States Patent
Toh et al.

(10) Patent No.: US 8,889,494 B2
(45) Date of Patent: Nov. 18, 2014

(54) FINFET

(75) Inventors: Eng Huat Toh, Singapore (SG); Jae Gon Lee, Singapore (SG); Chung Foong Tan, Singapore (SG); Elgin Quek, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 719 days.

(21) Appl. No.: 12/980,371

(22) Filed: Dec. 29, 2010

(65) Prior Publication Data

US 2012/0168913 A1    Jul. 5, 2012

(51) Int. Cl.
*H01L 21/84* (2006.01)
*H01L 21/00* (2006.01)
*H01L 29/78* (2006.01)
*H01L 29/66* (2006.01)

(52) U.S. Cl.
CPC ........ *H01L 29/66795* (2013.01); *H01L 29/785* (2013.01)
USPC .......................................... 438/149; 438/479

(58) Field of Classification Search
CPC .................. H01L 29/785; H01L 29/66795
USPC .................. 438/149–165, 479–481
See application file for complete search history.

(56) References Cited

U.S. PATENT DOCUMENTS

| 7,888,246 B2* | 2/2011 | Son et al. ................. 438/486 |
| 7,902,014 B2* | 3/2011 | Doyle et al. .............. 438/197 |
| 2004/0075122 A1 | 4/2004 | Lin et al. |
| 2006/0208286 A1 | 9/2006 | Shimada |
| 2007/0166891 A1* | 7/2007 | Park ....................... 438/149 |
| 2008/0111190 A1* | 5/2008 | Chang ..................... 438/151 |
| 2009/0039361 A1* | 2/2009 | Li et al. ................... 438/47 |
| 2009/0057780 A1* | 3/2009 | Wong et al. .............. 438/156 |

FOREIGN PATENT DOCUMENTS

| CN | 100459162 C | 2/2009 |
| DE | 112004000578 B4 | 1/2010 |

* cited by examiner

*Primary Examiner* — Cuong Q Nguyen
(74) *Attorney, Agent, or Firm* — Horizon IP Pte. Ltd.

(57) ABSTRACT

A fin type transistor includes a dielectric layer on a substrate surface which serves to isolate the gate of the transistor from the substrate. The dielectric layer includes a non-selectively etched surface to produce top portions of fin structures which have reduce height variations across the wafer. The fin type transistor may also include a counter doped region at least below the S/D regions to reduce parasitic capacitance to improve its performance.

17 Claims, 31 Drawing Sheets

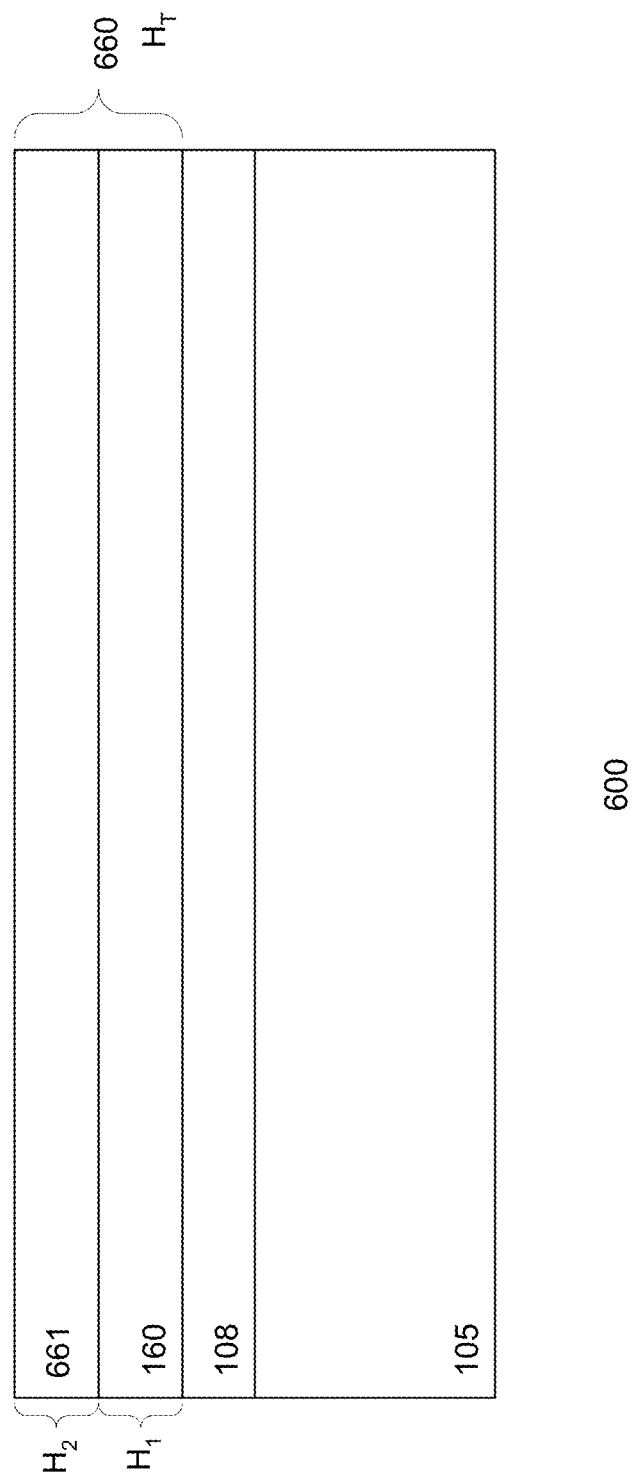

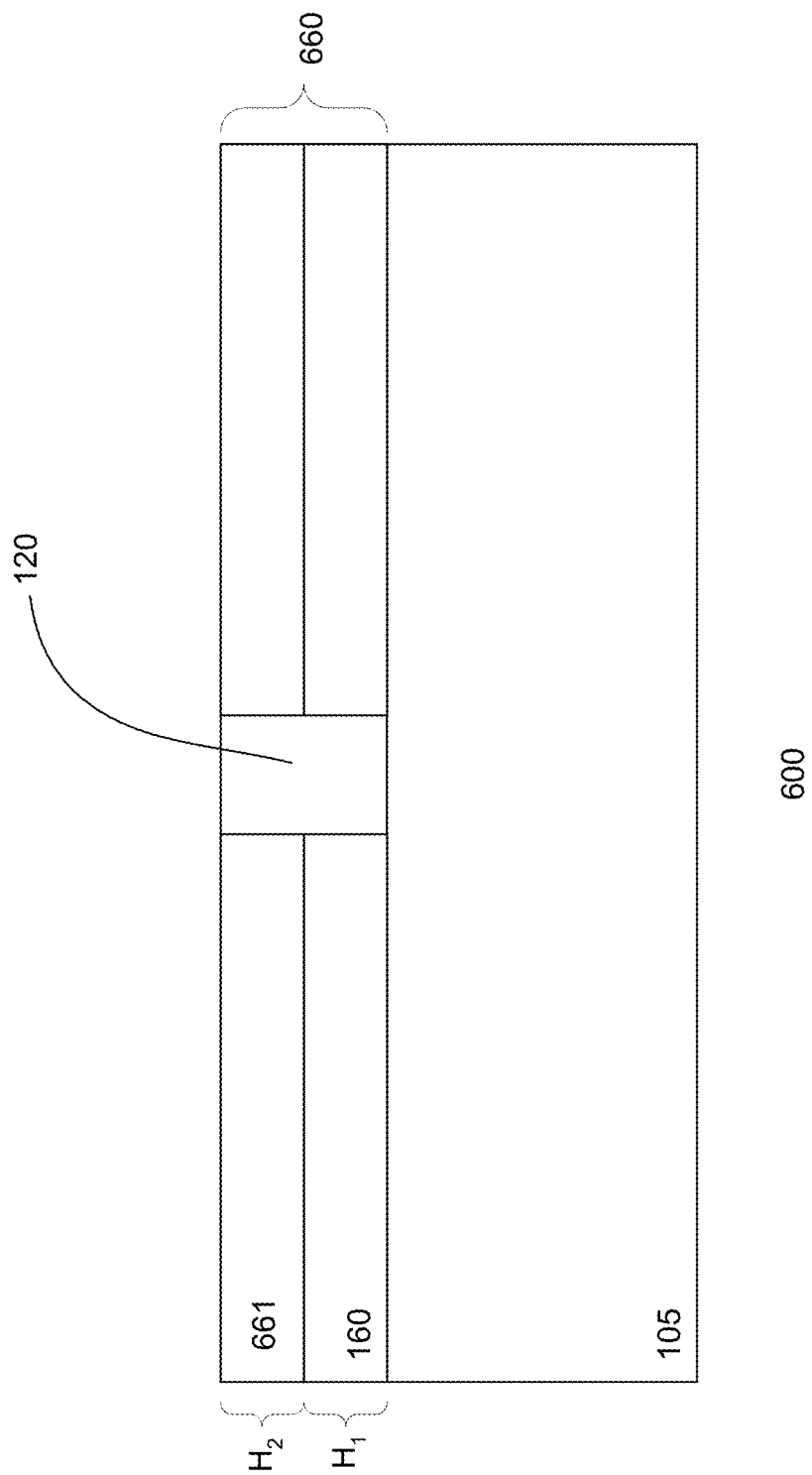

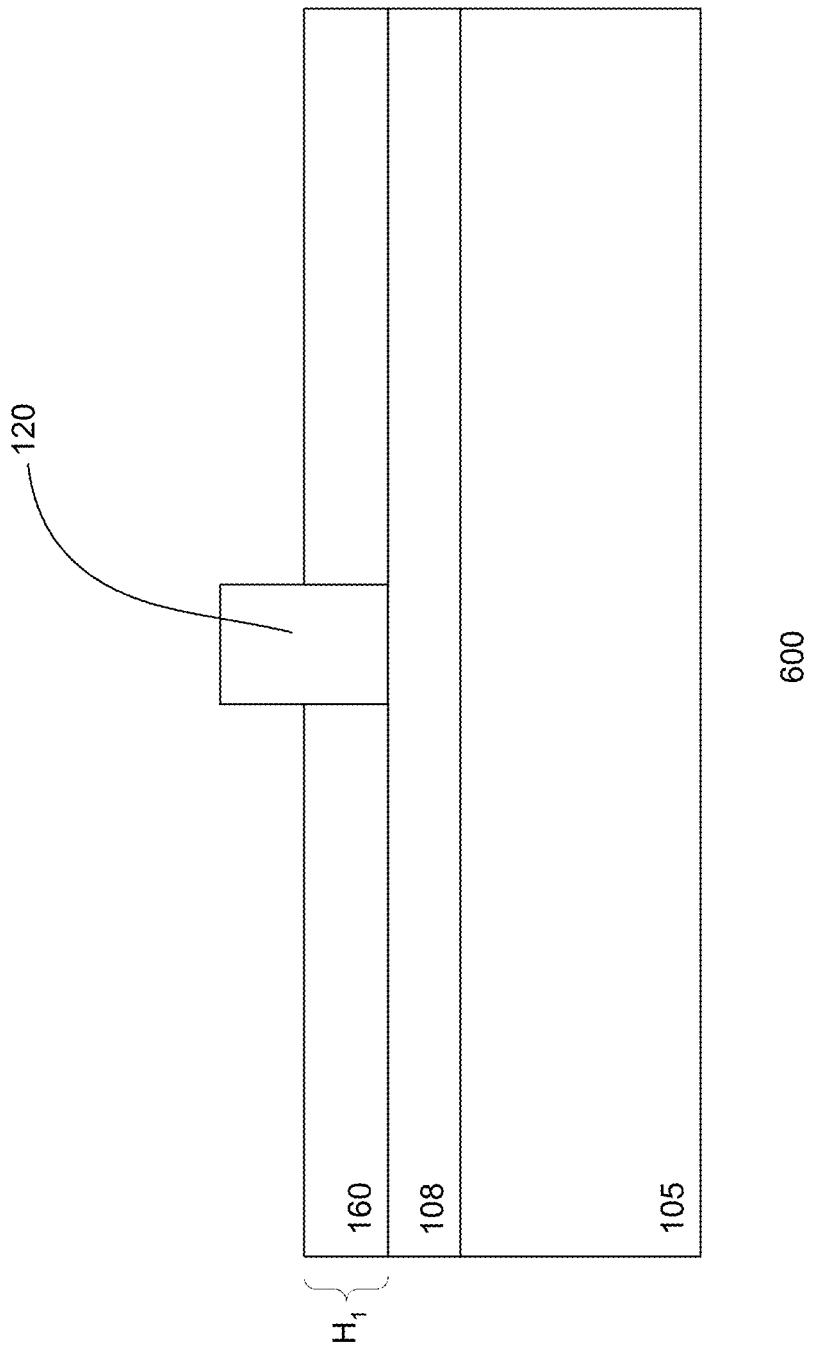

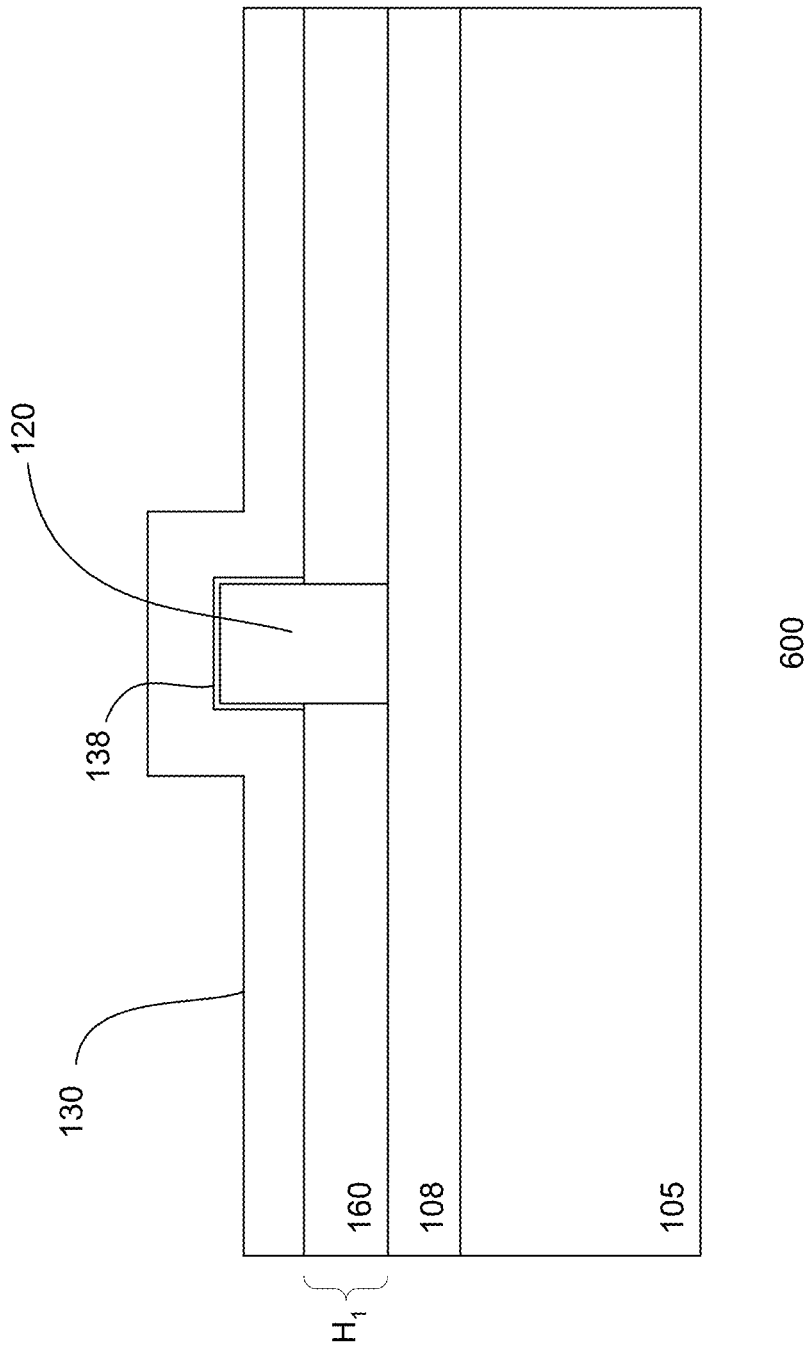

FINFET

CROSS-REFERENCE TO RELATED APPLICATION

This application cross-references to U.S. patent application, titled "FINFET WITH STRESSORS" (application Ser. No. 12/980,375); that is concurrently filed and assigned to the same assignee as this application, which is herein incorporated by reference for all purposes.

BACKGROUND

Fin type transistors have been investigated for future generation of devices, such as for sub-22 nm technology. This may be due to, for example, the fact that fin type transistors are conducive to high integration density. However, conventional fin type transistors exhibit high parasitic junction capacitance, which undesirably decrease performance. Additionally, conventional processes for forming fin type transistors result in large variations in height. This undesirably results in variations in device characteristics across the wafer, reducing reliability and yields.

From the foregoing discussion, it is desirable to provide a fin type device with improved performance and reduced variability.

SUMMARY

A method for forming a device is described herein. The method includes providing a substrate prepared with a device region which includes a doped isolation well and a dielectric layer over the substrate. The dielectric layer includes a second dielectric sub-layer over a first dielectric sub-layer. A fin structure is formed in the dielectric layer. The method further includes the step of removing a portion of the dielectric layer. The removal of the portion of the dielectric layer leaves an upper portion of the fin structure extending above a top surface of the first dielectric sub-layer. A gate which traverses the fin structure is formed and doped S/D regions in the fin structure are formed adjacent to the gate.

In another embodiment, a device having a substrate prepared with a dielectric layer on its top surface is disclosed. The dielectric top surface includes a non-selectively etched dielectric top surface. The device further includes a fin structure disposed on the substrate in the dielectric layer. The fin structure includes a bottom portion and a top portion. The top portion extends above the non-selectively etched dielectric top surface. The top portion determines a device height and the non-selectively etched top surface reduces height variation of fin structures across the wafer.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 6a-g show cross-sectional views of an embodiment of a process for forming a device;

DETAILED DESCRIPTION

The embodiments generally relate to devices, such as semiconductor devices or ICs. More particularly, some embodiments relate to transistors employed to form ICs. The ICs can be any type of IC. For example, the IC may be a dynamic or static random access memory, a signal processor, or a system on chip (SoC) device. The ICs can be incorporated into, for example, consumer electronic products, such as computers, cell phones, and personal digital assistants (PDAs). Other types of devices or products are also useful.

Figure 1A:
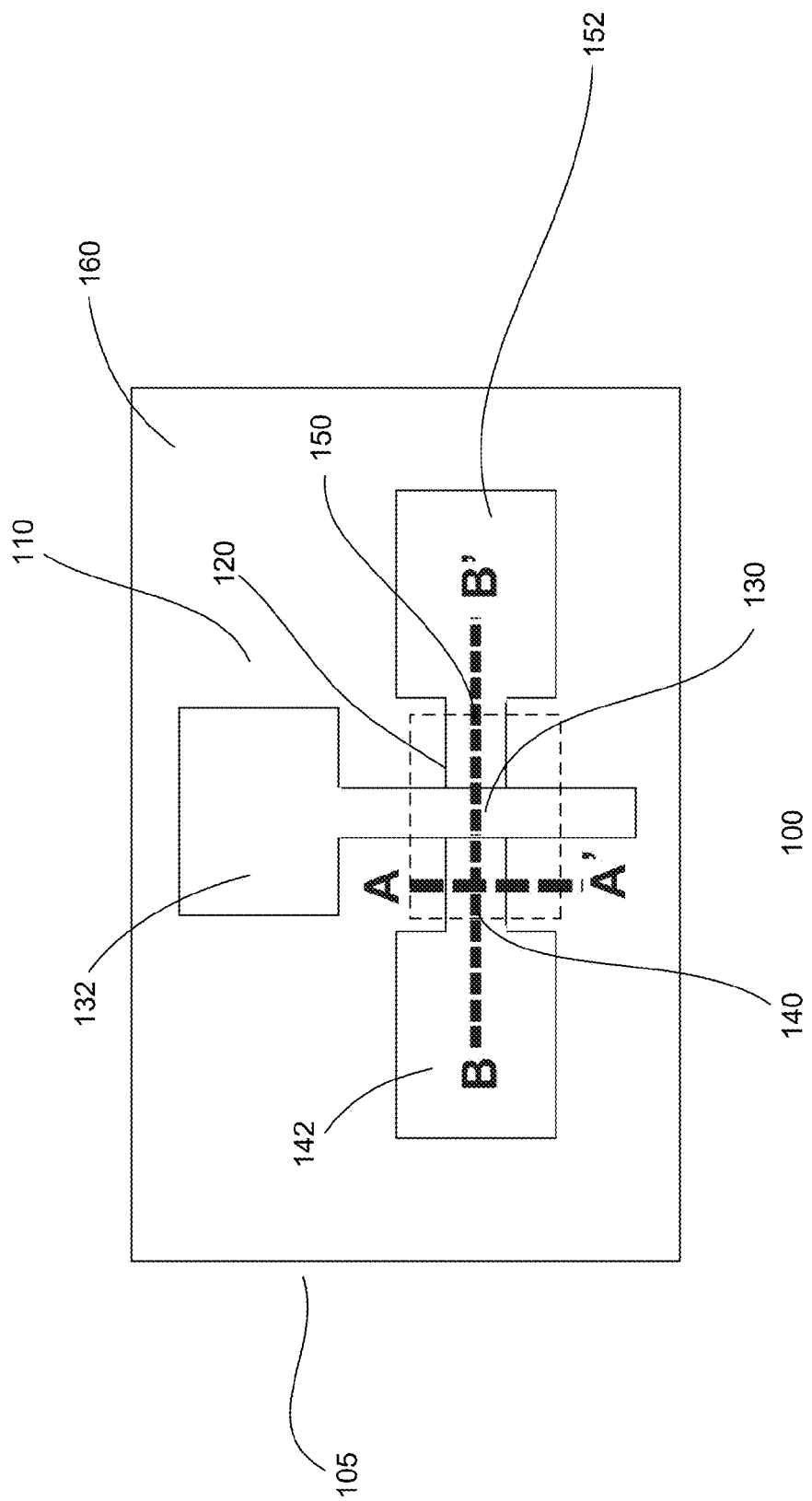
FIGS. 1a-c show various views of an embodiment of a device.
Figure 1B:
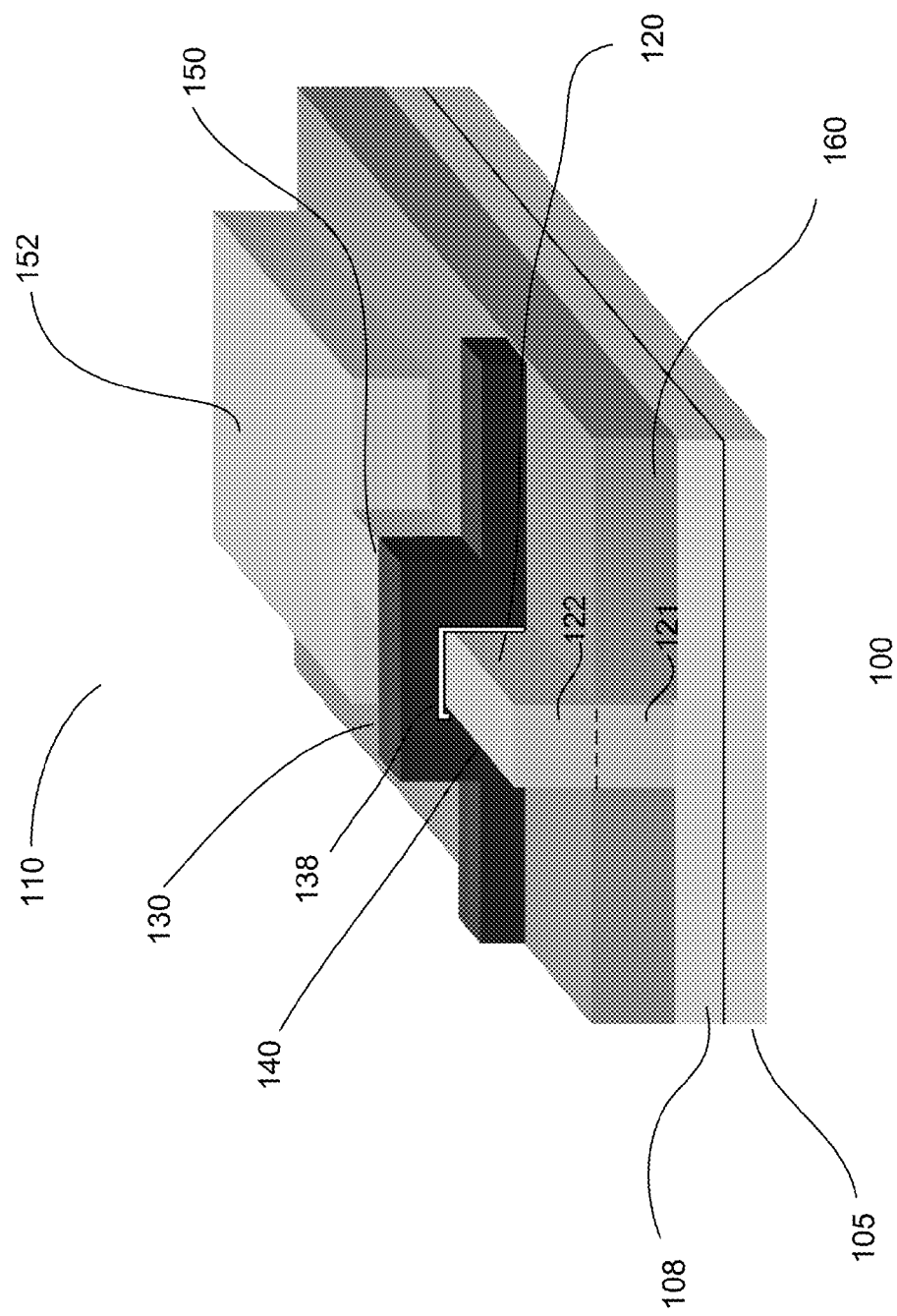
Figure 1C:
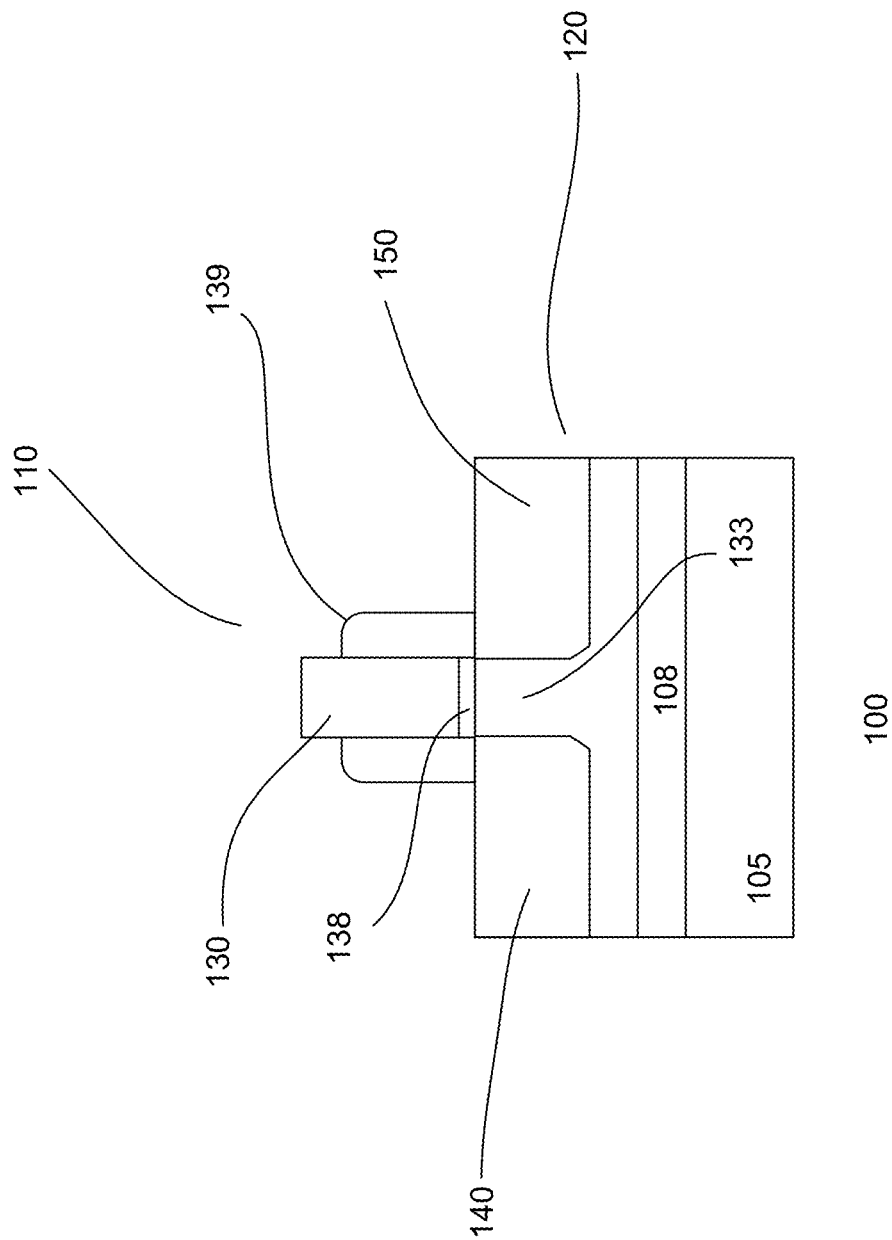

FIGS. 1a-c show various views of a device 100. FIG. 1a shows a top view while FIG. 1b shows a 3-dimensional view of the device along A-A' and FIG. 1c shows a cross-sectional view of the device along B-B'. The device, for example, comprises an IC. Other types of devices may also be useful. Referring to FIGS. 1a-c, a substrate 105 serves as a base for the device. The substrate, for example, comprises a silicon substrate. The substrate may be a lightly doped substrate. For example, the substrate may be a lightly doped p-type ($p^-$) substrate. In some embodiments, the substrate may be a lightly doped n-type ($n^-$) substrate. Other types of substrates may also be useful. For example, the substrate may be a heavily p-doped ($p^+$), n-doped or intrinsic substrate or a substrate having other types of semiconductor materials, such as silicon-germanium (SiGe), germanium (Ge), gallium-arsenic (GaAs) or any other suitable semiconductor materials, including subsequently developed materials.

The substrate is prepared with a device region for a transistor 110. The transistor, in one embodiment, comprises a finFET. The device may include other device regions (not shown). For example, the substrate may include other device regions for which other types of transistors or components of the IC may be formed. For example, the substrate may include p-type and n-type components, such as high, medium and low voltage p-type and n-type components. Various types of n-type and p-type wells are provided for these components. P-type dopants can include boron (B), aluminum (Al), indium (In) or a combination thereof, while n-type dopants can include phosphorus (P), arsenic (As), antimony (Sb) or a combination thereof.

The device region, for example, may be isolated from other device regions by, for example, a dielectric layer 160. The dielectric layer is disposed on the surface of the substrate. The dielectric layer comprises, in one embodiment, silicon oxide. In other embodiments, the dielectric layer may comprise silicon nitride. Other types of dielectric layers, including multiple dielectric layers, may also be useful. For example, the dielectric layer may comprise a second dielectric layer over a first dielectric layer. The second dielectric layer may serve as an etch stop to protect the first dielectric layer. For example, a silicon nitride layer may be provided over a silicon oxide layer or a silicon oxide layer may be provided over a silicon nitride layer. The dielectric layer serves to electrically isolate a gate 130 of the transistor from the substrate. The thickness of the dielectric layer, for example, may be about 30-500 nm. In other embodiments, the thickness of the dielectric layer may be about 30-100 nm. Other thicknesses may also be useful.

In one embodiment, the dielectric layer comprises a non-selectively etched top surface. The non-selectively etched top surface, for example, has been etched with a low etch rate chemistry with respect to the dielectric layer. The low etch chemistry has a high etch rate for removal of a layer above selective to the dielectric layer. For example, the low etch chemistry etches the dielectric layer at a low ratio such as about 1:5 or 1:10 compared to the layer above. Other low etch ratios may also be useful.

In some embodiments, isolation regions, such as shallow trench isolation regions, may be provided for substrates having hybrid planar and/or 3-dimensional devices for isolating such devices. In other embodiments, the dielectric layer may also be used to isolate hybrid devices. Other types of isolation regions may also be useful.

A doped isolation well 108 is disposed on an upper portion of the substrate in the device region. The isolation well, in one embodiment, comprises dopants of a second polarity type. For example, the isolation well may contain p-type dopants for a n-channel device. Alternatively, a n-type isolation well may be provided for a p-channel device. The isolation well may be lightly or intermediately doped with the second polarity dopant type. For example, the dopant concentration of the isolation well may be about $10^{16}$-$10^{19}$ atoms/cm$^3$. Other dopant concentrations may also be useful for the isolation well. The isolation well may serve to isolate a first type device from a second type device. For example, a p-type isolation well is used to isolate a n-type device from a p-type device or a n-type isolation well is used to isolate a p-type device from a n-type device.

The transistor, in one embodiment, comprises a fin structure 120 disposed on the surface of the substrate. The fin structure may be an intrinsic or undoped fin structure. In some embodiments, the fin structure may be a lightly doped fin structure having second polarity type dopants. The second polarity doped fin structure is used for, for example, a first polarity type device. For example, the fin structure may comprise p-type dopants for a n-channel device or n-type dopants for a p-channel device. The fin structure, for example, may be an elongated member with a rectangular cross-section. Other types of fin structures may also be useful. As shown, the fin structure is disposed along a first direction (e.g., x direction).

The fin structure includes bottom and top device portions 121 and 122. The top device portion is the portion of the fin structure above the surface of the dielectric layer and the bottom device portion is the portion below the surface of the dielectric layer to the top of the substrate, as indicated by the dotted line. For example, the bottom device portion has a height equal to the thickness of the dielectric layer. The height of the top portion determines the device height. For example, the height of the top portion may factor in determining a channel width of the device.

The height of the top device portion of the fin structure may be about 100-1000 Å. In some embodiments, the height of the top portion of the fin structure is about 200-800 Å. In other embodiments, the height of the top portion of the fin structure is about 200-500 Å. The width of the fin structure may be about 100-1000 Å. In some cases, the width of the fin structure may be included in determining the channel width of the device. Other dimensions for the fin structure may also be useful. The dimensions of the fin structure, for example, may depend on device or design requirements.

The fin structure, for example, comprises a material capable of having good or high carrier mobility. In one embodiment, the fin structure comprises a crystalline material. The crystalline material may be a recrystallized crystalline material. In other embodiments, the crystalline material may be an epitaxial crystalline material. In some embodiments, the fin structure may comprise a combination of crystalline and recrystallized crystalline materials. For example, a portion of the fin structure may be epitaxial crystalline material while another portion may be recrystallized crystalline material. For example, a lower portion of the fin structure may be epitaxial crystalline material and an upper portion may be recrystallized crystalline material. Other configuration of crystalline and recrystallized materials may also be useful. In one embodiment, the crystalline material comprises silicon. Other types of crystalline material may also be useful. For example, the fin structure may comprise SiGe, Ge or GaAs or a combination of the various crystalline materials, including silicon.

In some embodiments, the fin structure may comprise a polycrystalline or amorphous material. Providing a fin structure of polycrystalline or amorphous material may be, for example, useful for thin film applications.

A gate 130 is disposed on the dielectric layer. The gate, for example, comprises an elongated member with a rectangular cross-section. Other types of gates may also be useful. In one embodiment, the gate is disposed on the dielectric layer along a second direction (e.g., y direction) and traverses the fin. The second direction, for example, is perpendicular to the first direction. Providing first and second directions which are not perpendicular to each other may also be useful. The dielectric layer, for example, provides isolation to prevent the region under the gate on the dielectric layer from turning on. The gate, as shown, wraps around the fin.

The gate, in one embodiment, comprises a semiconductor material. For example, the gate comprises polysilicon. Other types of materials may also be used to form the gate. For example, the gate comprises a metal gate, such as TaN or TiN. Separating the gate and the fin is a gate dielectric layer 138. The gate dielectric layer, for example, comprises silicon oxide. Other types of gate dielectric material may also be useful. For example, the gate dielectric layer may be HfSiON, SiON or HfO$_2$. In some embodiments, the gate dielectric may further include a work function tuning layer. For example, La$_2$O$_3$ may be provided for a n-type device while TiN/Al/TiN may be provided for a p-type device in addition to HfSiON and/or HfO$_2$.

Dielectric spacers 139 may be provided on sidewalls of the gate. The dielectric spacers, for example, may comprise silicon nitride. Other types of dielectric materials may also be used. For example, the spacers may comprise silicon nitride or multiple layers of dielectric materials, such as silicon oxide and silicon nitride. In other embodiments, no dielectric spacers are provided on the gate sidewalls.

First and second source/drain (S/D) regions 140 and 150 are disposed in the fin adjacent to the gate. The S/D regions comprise dopants of a first polarity type for a first type device. For example, the S/D regions may contain n-type dopants for a n-type or n-channel device or p-type dopants for a p-type or p-channel device. The S/D regions, in one embodiment, are heavily doped regions. For example, the dopant concentration of the S/D regions may be about $10^{18}$-$10^{20}$ atoms/cm$^3$. The depth or bottom of the S/D regions, for example, may be located at about the top surface of the dielectric layer. Providing the bottom of the S/D regions at other locations in the fin structure may also be useful. For example, the bottom of the S/D regions may be located above or below the surface of the dielectric layer. In other embodiments, the bottom of the S/D regions may occupy the fin structure. In some embodiments, the bottom of the S/D regions may extend below the bottom of the dielectric layer into the isolation well in the substrate. A channel 133 is located in the upper portion of the fin between the S/D regions and below the gate.

In some embodiments, the S/D regions may be provided with S/D extension regions. The S/D extension regions may be lightly doped portions of the S/D regions. The S/D extension regions, for example, extend beneath the spacers to connect the channel to the S/D regions. In some embodiments, the S/D extension profile may extend beneath the gate. Providing a S/D extension profile which underlaps the gate may increase resistance and to have better short channel effect.

First and second S/D contact pads 142 and 152 may be provided. The first and second contact pads are coupled to ends of the fin. For example, the first S/D contact pad is coupled to a first end of the fin and the second S/D contact pad is coupled to a second end of the fin. The contact pads may be rectangular in shape. Other shapes may also be useful. The contact pads, in one embodiment, may be integral parts of the fin. For example, the contact pads may be heavily doped with first polarity type dopants and may be an extension of the S/D regions. Other types or configurations of contact pads may also be useful. Contacts may be coupled to the S/D contact pads for coupling to the S/D regions.

A gate contact pad 132 may be provided on the dielectric layer. The gate contact pad is coupled to, for example, an end of the gate. As shown, the gate is provided with one contact pad 132 disposed on a first end of the gate. The gate contact pad may be rectangular in shape. Other shapes may also be useful. The gate contact pad, in one embodiment, may be an integral part of the gate. Other types or configurations of gate contact pad may also be useful.

In other embodiments, two gate contacts may be provided. Two gate contacts can be used for a transistor with two independent gates. For example, gate contacts may be provided at first and second ends of the gate. For embodiments with two independent gates, the gate may be separated at the top of the fin structure to form two separate gates. For example, the portion of the gate above the surface of the fin structure is removed.

Although a single fin structure is shown, some embodiments may include a plurality of fin structures configured in a closely packed manner. The fin structures may be controlled by a common gate. Such an arrangement forms, for example, multiple transistors arranged in a finger configuration to increase drive current. In other embodiment, the fin structures may be independently controlled by respective gates or a combination of common and independent gates.

As described, the dielectric layer on the substrate has a non-selectively etched top surface. The dielectric layer with the non-selectively etched top surface enables the top device portion of the fin structures to be more consistent from fin structure to fin structure across the wafer. Since the top portion of the fin structure determines the height of the device, reducing height variation of the top portion of the fin structures results in more consistent device characteristics across the wafer.

Figure 2A:
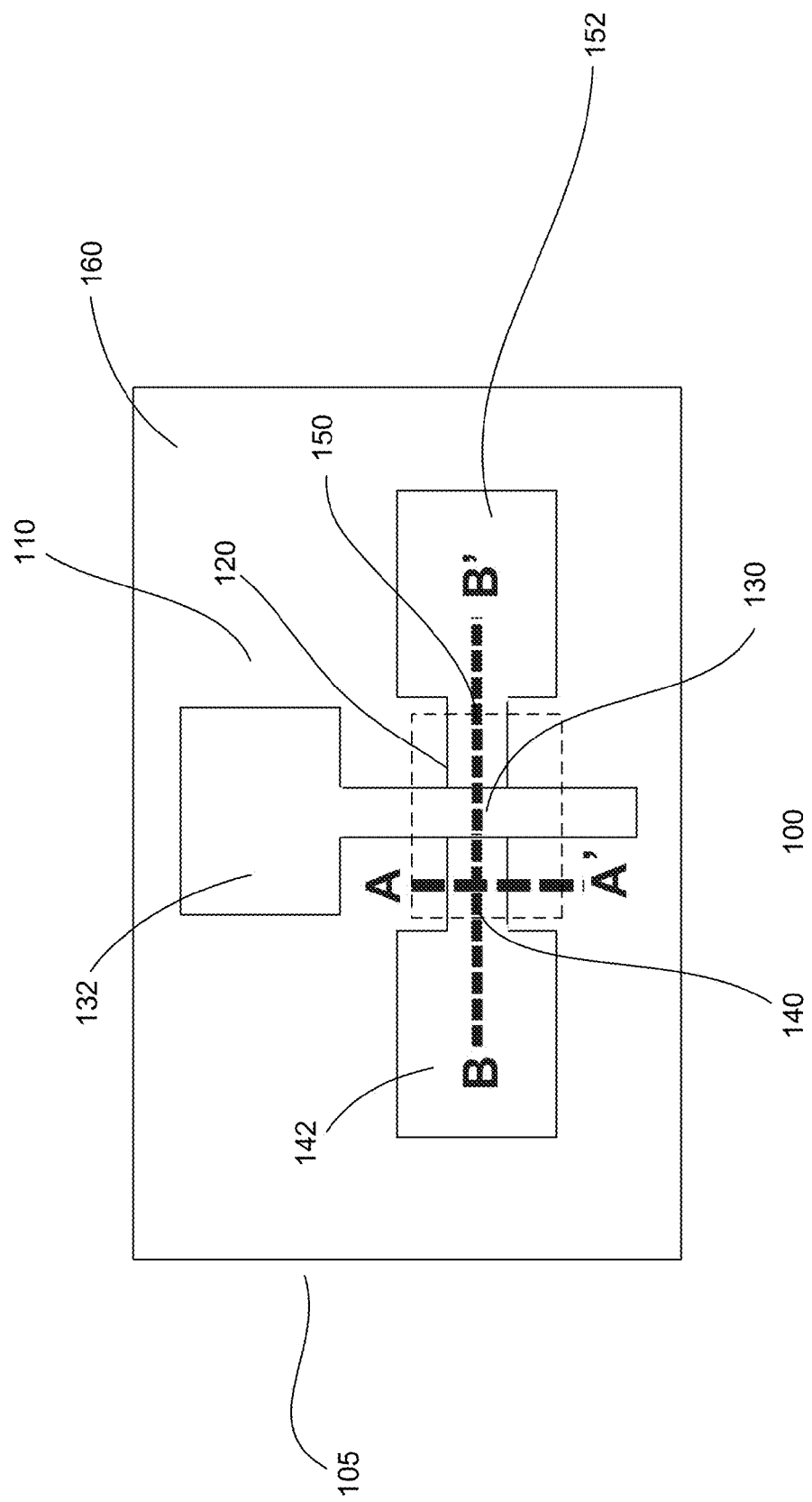
FIGS. 2a-c show various views of another embodiment of a device.
Figure 2B:
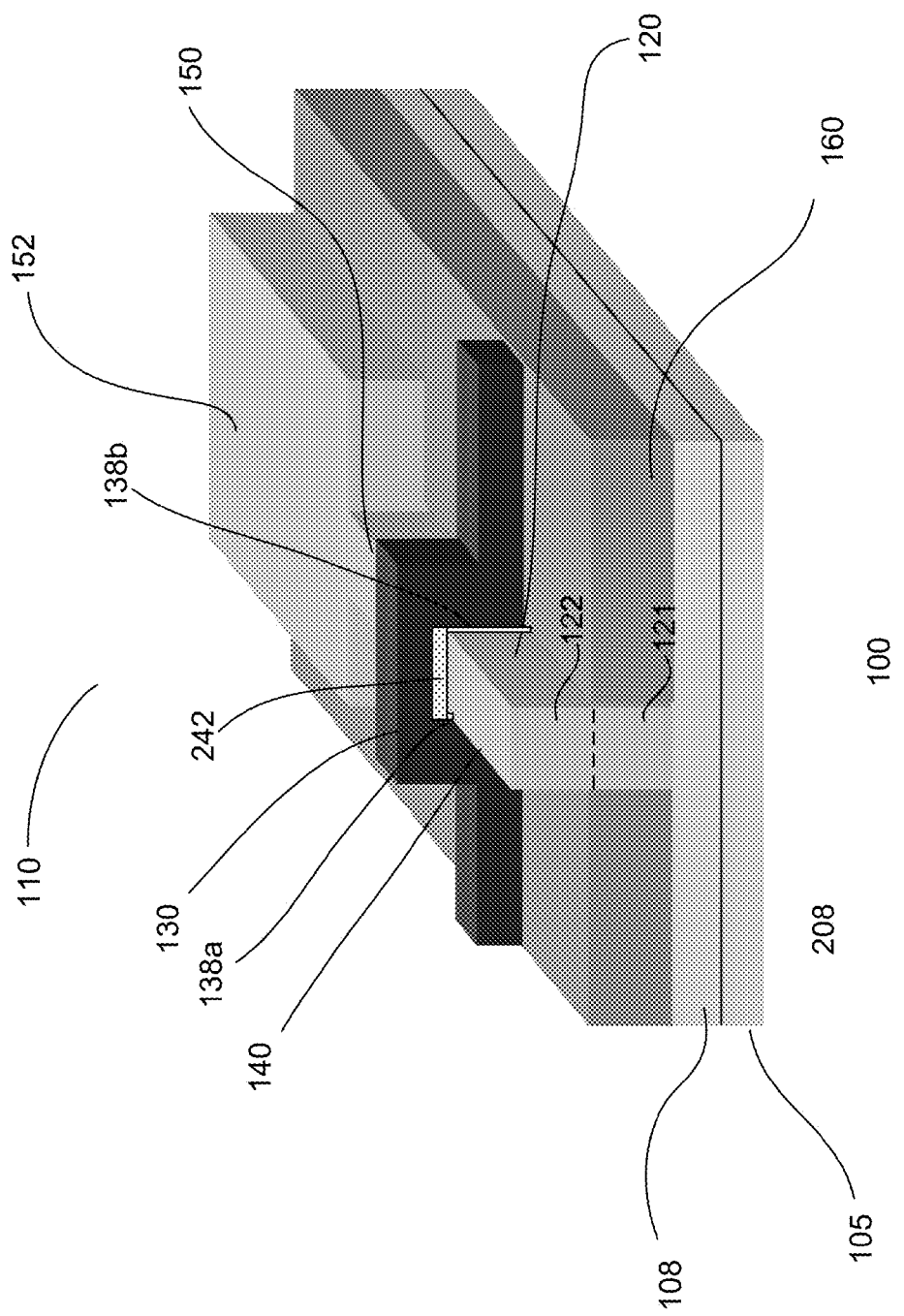
Figure 2C:
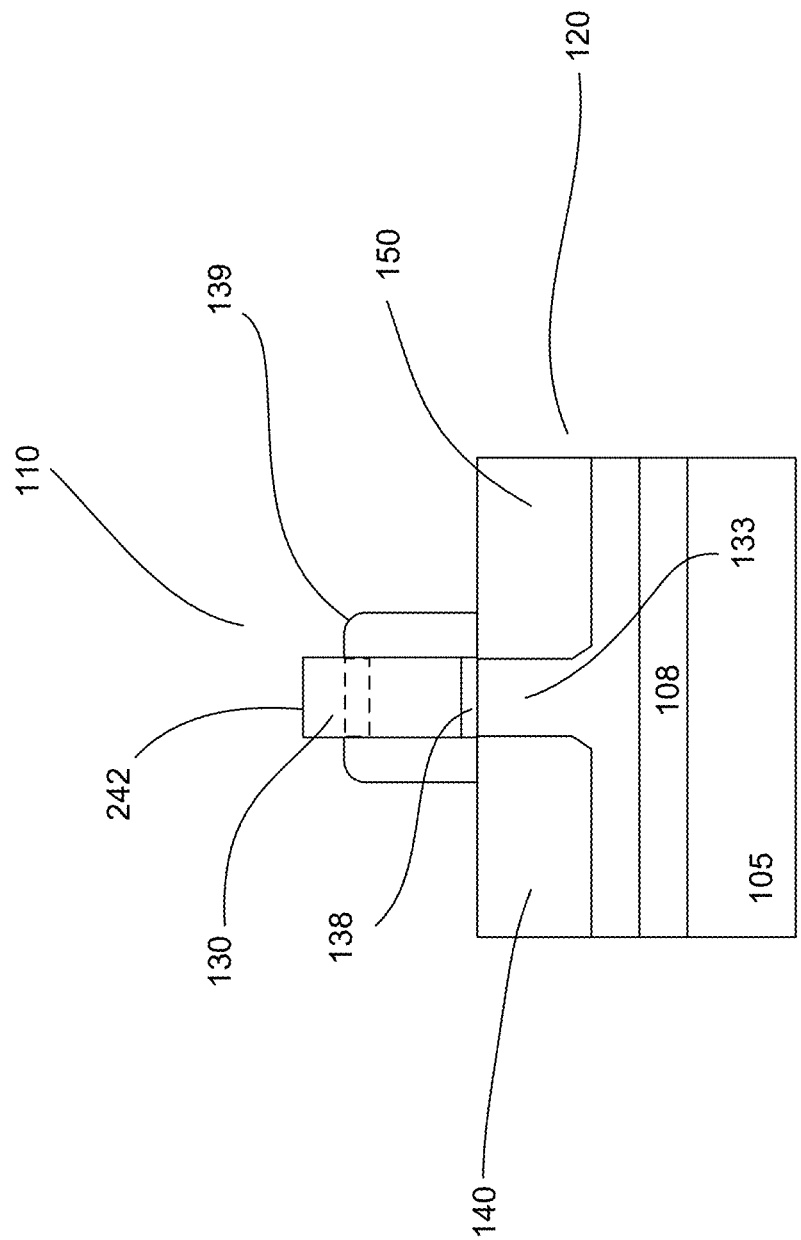

FIGS. 2*a-c* show various views of another embodiment of a device 100. FIG. 2*a* shows a top view while FIG. 2*b* shows a 3-dimensional view of the device along A-A' and FIG. 2*c* shows a cross-sectional view of the device along B-B'. The device, for example, is similar to that described in FIGS. 1*a-c*. As such, the common features need not be discussed.

In one embodiment, a hard mask layer 242 is provided on the top surface of the fin structure 120. The hard mask layer, for example, comprises silicon nitride. Other types of dielectric hard mask material may also be useful. The hard mask serves to separate the gate dielectric layer into two gate dielectric layers 138*a-b* on the sides of the fin structure. The use of the hard mask results in the transistor having a double gate. The two gates of the double gate may be commonly controlled with a single gate signal. Providing a double gate gives greater flexibility to designer for defining the width and height of the fin structures.

In other embodiments, the double gate may be independently controlled by two independent gate signals. In the case of two independent gates, the gate may be separated, for example, at the top of the gate. The hard mask may serve as an etch stop for patterning the gate. For example, the portion of the gate above the fin structure may be removed by polishing, such as chemical mechanical polishing (CMP), using the hard mask as a polish stop. Other techniques for forming double independent gates may also be useful.

Figure 3A:
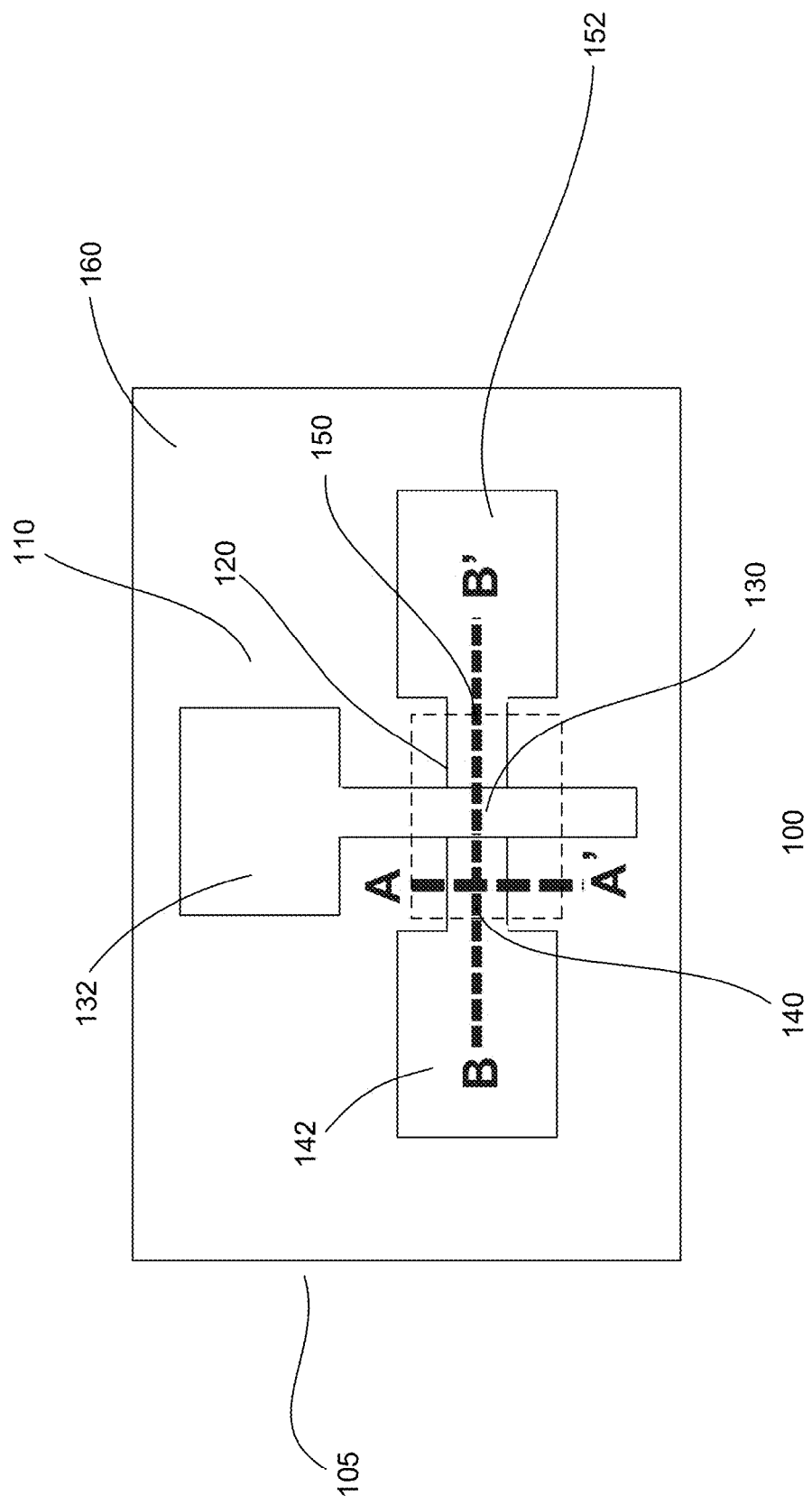
FIGS. 3a-c show various views of another embodiment of a device.
Figure 3B:
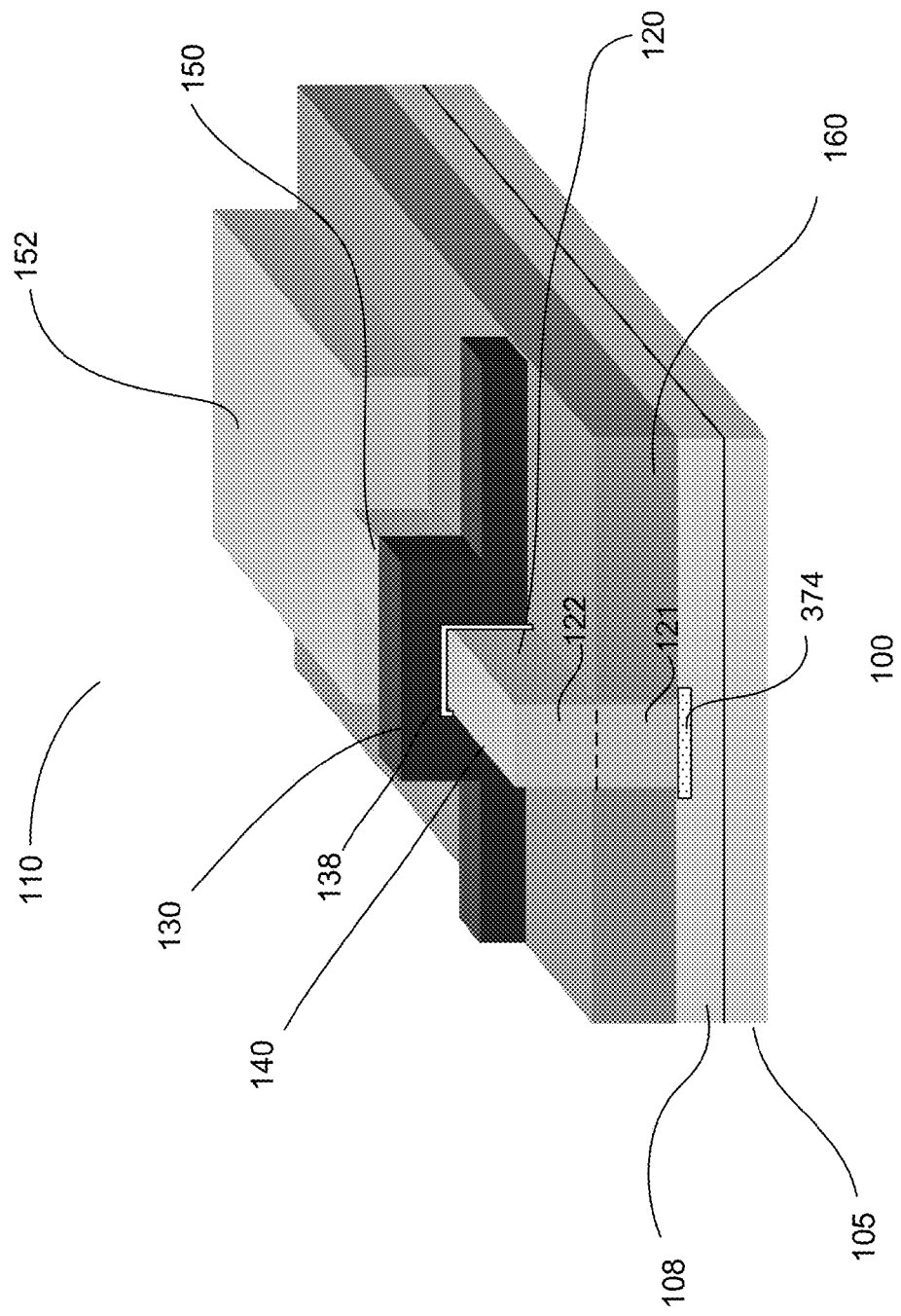
Figure 3C:
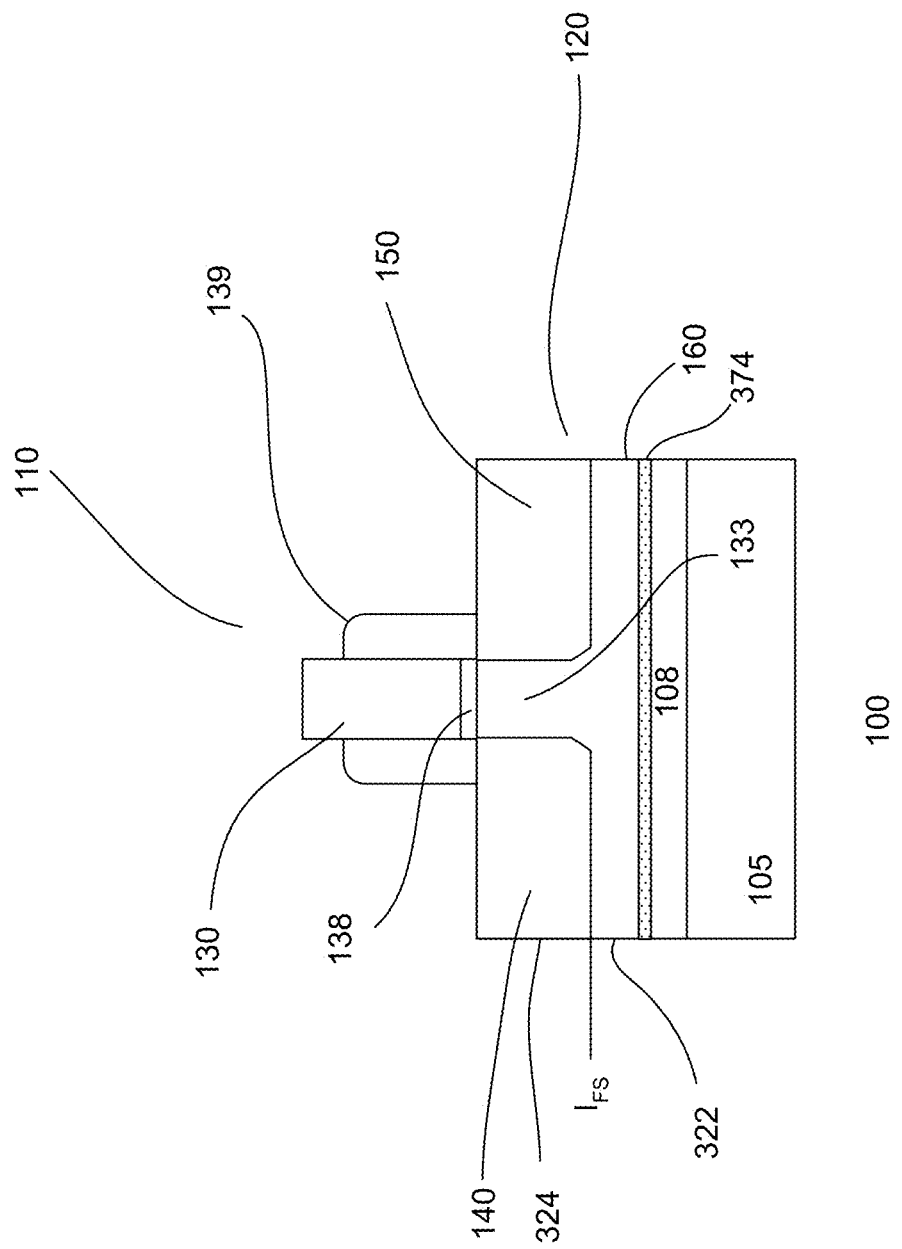

FIGS. 3*a-c* show various views of another embodiment of a device 100. FIG. 3*a* shows a top view while FIG. 3*b* shows a 3-dimensional view of the device along A-A' and FIG. 3*c* shows a cross-sectional view of the device along B-B'. The device, for example, comprises an IC. Other types of devices may also be useful. The device shown in FIGS. 3*a-c* is similar to that shown in FIGS. 1*a-c*. As such, the common features need not be discussed.

In one embodiment, the fin structure 120 is divided into first and second portions 322 and 324. The first portion, for example is below the second portion. In one embodiment, the S/D regions are disposed in the second portion. In one embodiment, an interface of the first and second portions $I_{FS}$ defines the bottoms of the S/D regions. The interface $I_{FS}$ can be disposed in different locations of the fin structure. For example, the $I_{FS}$ may be located at about the interface of the bottom and top device portions of the fin structure (e.g., at about the top surface of the dielectric layer). In other embodiments, the interface of the first and second portions may be located at other depths. For example, the interface of the first and second portions may be located above or below the surface of the dielectric layer or interface of the bottom and top device portions of the fin structure.

In one embodiment, a counter doped well 374 is disposed in the substrate below the bottom of the fin structure. The counter doped well comprises first polarity type dopants, which is the same polarity type as the S/D regions. The counter doped well is disposed within the isolation well 108 having second polarity type dopants. In one embodiment, the counter doped well may be a lightly to intermediately doped well. For example, the dopant concentration of the counter doped well may be about $1E10^{18}$ atoms/cm$^3$. Other dopant concentrations may also be useful. The counter doped well for example is disposed below the fin structure, including below the S/D regions and the channel. This, for example, produces a silicon on depletion layer (SODEL) device. Alternatively, the counter doped well may be disposed below the S/D regions but not the channel. This, for example, produces a source/drain on depletion layer (SDODEL) device.

The first portion of the fin structure separates the S/D regions from the counter doped well. The first portion, for example, serves as a depletion region in the fin structure between the S/D region and the counter doped well. The height of the first portion should be selected to enable the depletion regions of the S/D drain regions to merge with the depletion region of the counter doped well at zero bias. For example, at zero bias between the S/D regions and the counter doped well, their depletion regions merge. In one embodiment, the height of the lower portion or distance between the S/D regions and counter doped well (e.g., $I_{FS}$) should be selected to provide a depletion region which is fully depleted at zero bias. The height of the lower portion or $I_{FS}$ may depend on the doping of the counter doped well and the S/D regions. The height of the first portion can be tuned based on the doping of the S/D regions and counter doped well to provide a fully depleted region.

By providing a counter doped well, the depletion region of the S/D regions can be extended deeper to increase its width. Increasing the width of the depletion regions reduces the junction capacitance $C_j$ of the device. The larger the separation between the counter doped well and the S/D region while maintaining the merger of the depletion regions, the greater the reduction in $C_j$. Preferably, the thickness of the first portion should be as large as possible while maintaining the merger of the depletion regions to produce the largest depletion width for the greatest reduction in $C_j$.

In some embodiments, the device of FIGS. 3a-c may be provided with a hard mask layer, as described in FIGS. 2a-c, to provide a transistor with a double gate.

Figure 4A:
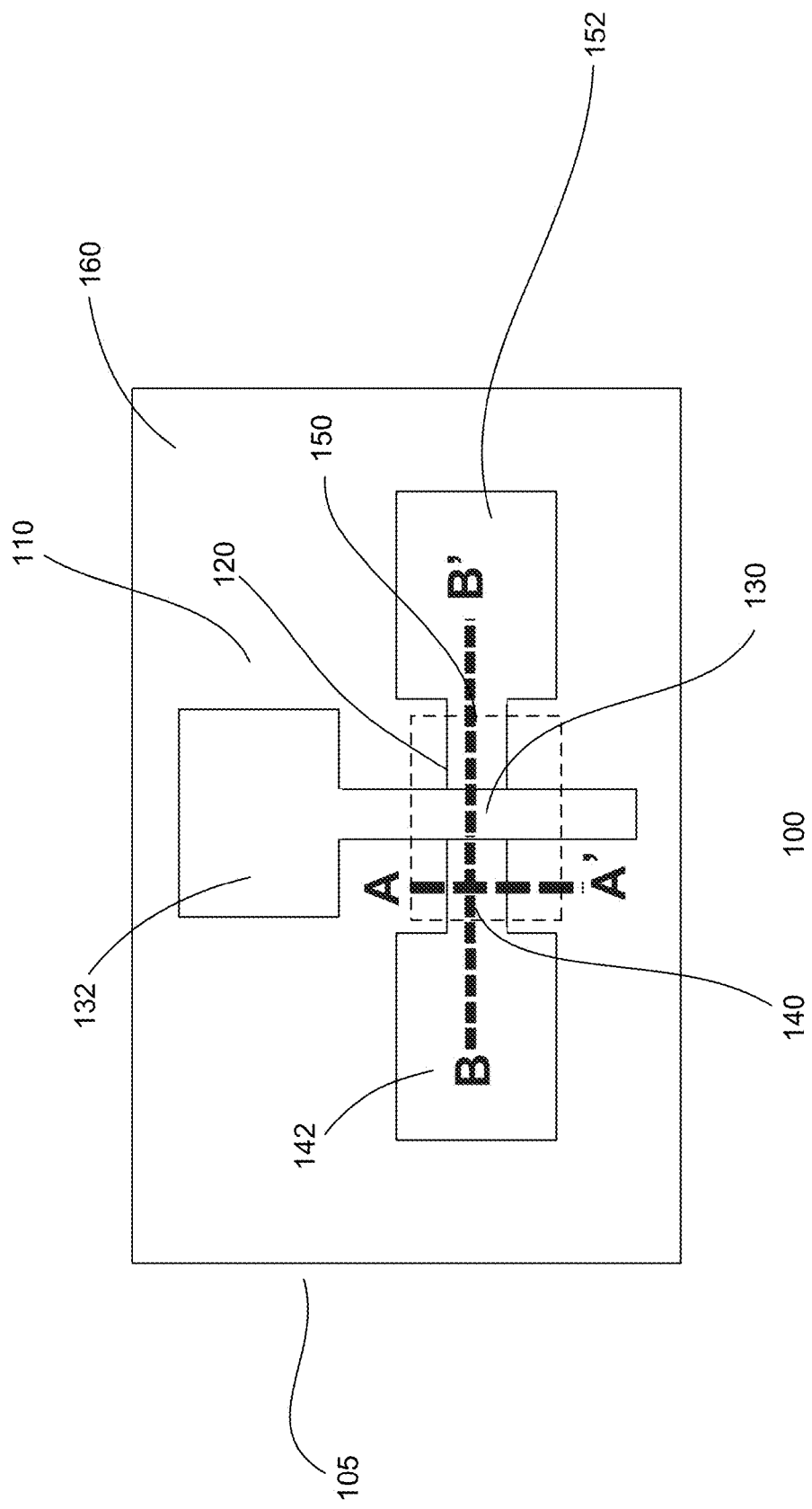
FIGS. 4a-c show various views of yet another embodiment of a device.
Figure 4B:
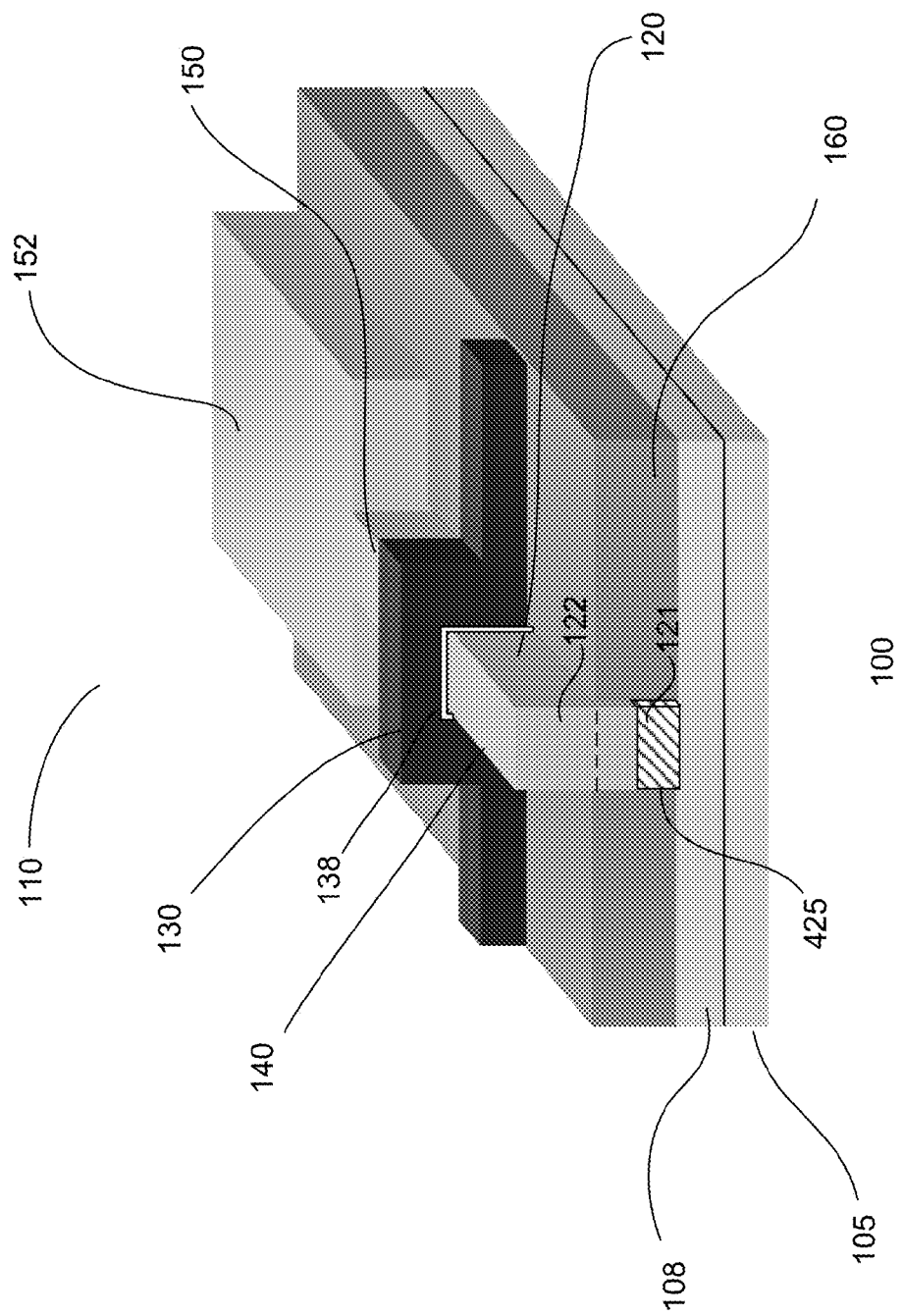
Figure 4C:
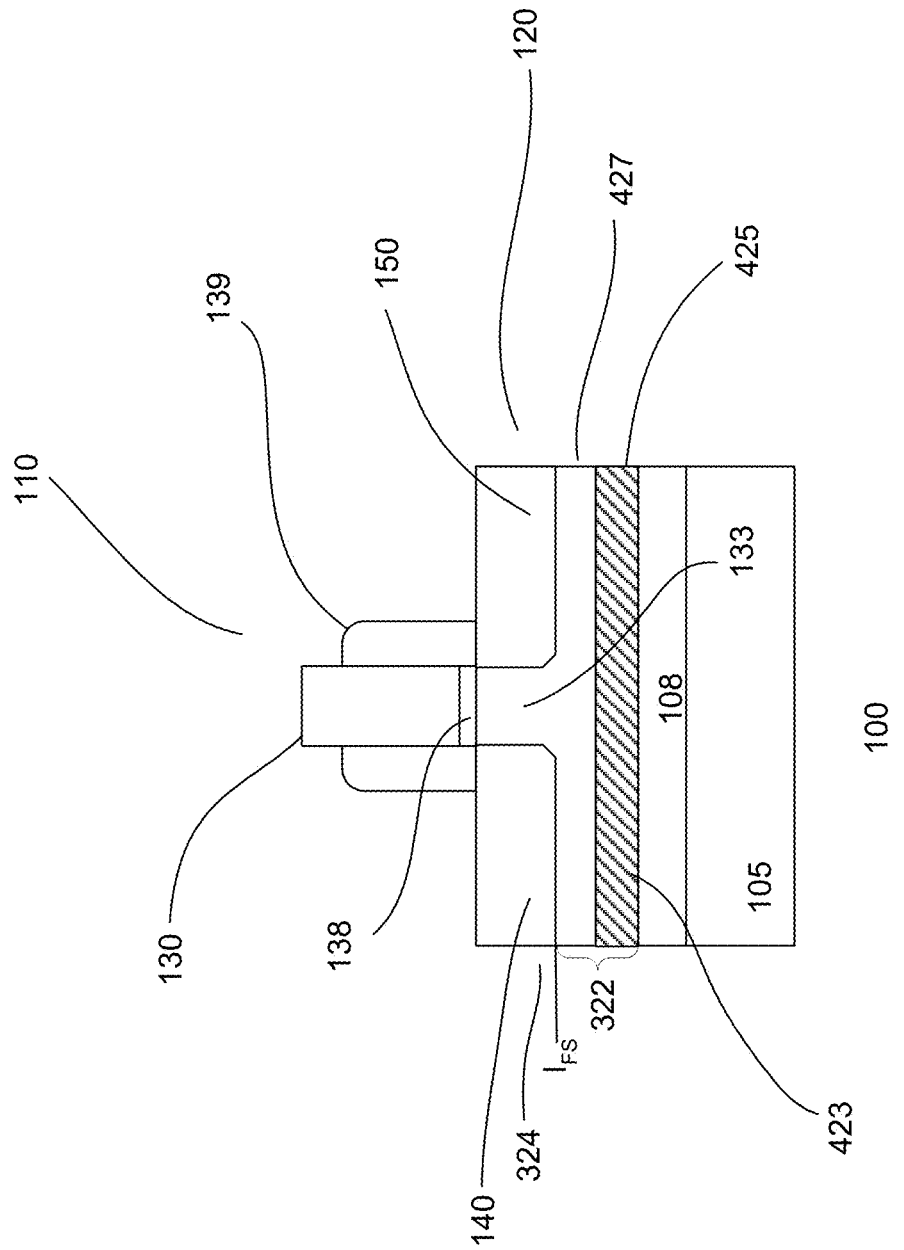

FIGS. 4a-c show various views of another embodiment of a device 100. FIG. 4a shows a top view while FIG. 4b shows a 3-dimensional view of the device along A-A' and FIG. 4c shows a cross-sectional view of the device along B-B'. The device, for example, comprises an IC. Other types of devices may also be useful. The device shown in FIGS. 4a-c is similar to that shown in FIGS. 1a-c. As such, the common features need not be discussed.

In one embodiment, the fin structure 120 is divided into first and second portions 322 and 324. The first portion, for example is below the second portion. In one embodiment, the S/D regions are disposed in the second portion. In one embodiment, the interface of the first and second portions $I_{FS}$ defines the bottoms of the S/D regions. The interface $I_{FS}$ can be disposed in different locations of the fin structure. For example, the $I_{FS}$ may be located at about the interface of the bottom and top device portions of the fin structure. For example, $I_{FS}$ may be disposed at about the top surface of the dielectric layer. In other embodiments, the interface of the first and second portions may be located at other depths. For example, the interface of the first and second portions may be located above or below the surface of the dielectric layer or interface of the bottom and top device portions of the fin structure.

The first portion is separated into upper and lower first portions 427 and 425. The lower first portion may serve as a bottom portion of the fin structure while the upper first portion may serve as an intermediate portion between the lower first portion and the second portion of the fin structure. A counter doped region 423 is disposed in the lower first portion. The counter doped region, in one embodiment, is disposed in the lower first portion of fin structure below the S/D regions and the channel. The counter doped region may also be provided below the S/D contact regions. This, for example, produces a SODEL device.

The counter doped region comprises first polarity type dopants, which is the same polarity type as the S/D regions. In one embodiment, the counter doped region may be a lightly to intermediately doped region. For example, the dopant concentration of the counter doped region may be about $1E10^{18}$ atoms/cm$^3$. Other dopant concentrations may also be useful. In one embodiment, the dopant concentration is consistent throughout the counter doped region. For example, no tailing off of dopants occur at or near the bottom of the counter doped region. This reduces random-dopant-fluctuation (RDF), which can undesirably cause variations in $V_T$.

The upper first portion, for example, is an intermediate region which separates the S/D regions from the counter doped region. The upper first portion, for example, serves as a depletion region in the fin structure between the S/D region and the counter doped region in the lower first portion. The height of the upper first portion should be selected to enable the depletion regions of the S/D drain regions to merge with the depletion region of the counter doped region at zero bias. For example, at zero bias between the S/D regions and the counter doped region, their depletion regions merge. In one embodiment, the height of the upper first portion or distance between the S/D regions and counter doped region should be selected to provide a depletion region which is fully depleted at zero bias. The height of the upper first portion may depend on the doping of the counter doped well and S/D regions. The height of the upper first portion can be tuned based on the doping of the S/D regions and counter doped well to provide a fully depleted region.

By providing a counter doped region, the depletion regions of the S/D regions can be extended deeper to increase their widths. Increasing the widths the of the depletion regions reduces the junction capacitance $C_j$ of the device. The larger the separation between the counter doped region and the S/D regions while maintaining the merger of the depletion regions, the greater the reduction in Cj. Preferably, the thickness of the upper first or intermediate portion should be as large as possible while maintaining the merger of the depletion regions to produce the largest depletion width for the greatest reduction in $C_j$.

The counter doped region provides flexibility in designing S/D regions. The interface $I_{FS}$ of the first and second regions, which defines the bottom of the S/D regions, can be designed with greater flexibility while increasing the widths of the depletion regions. For example, adjusting the height of the counter doped region may increase or decrease the depth of S/D regions while maintaining a fully depleted depletion region between the S/D regions and counter doped region. For example, S/D regions having shallower depths may be provided by increasing the height of the counter doped region or deeper S/D regions may be provided by decreasing the height of the counter doped region.

The fin structure, for example, comprises a material capable of having good or high carrier mobility. In one embodiment, the fin structure comprises a crystalline material. The crystalline material may be a recrystallized crystalline material. In other embodiments, the crystalline material may be epitaxial crystalline material. In some embodiments, the fin structure may comprise a combination of crystalline and recrystallized crystalline materials. For example, a portion of the fin structure may be epitaxial crystalline material while another portion may be recrystallized crystalline material. In one embodiment, the lower first portion of the fin structure may be epitaxial crystalline material while the upper first portion and second portion may be recrystallized crystalline material. The lower first portion may be in situ doped or doped by ion implantation. Other configuration of crystalline and recrystallized materials may also be useful. For example, the lower and upper first portions may be epitaxial crystalline material and the second portion comprises recrystallized crystalline material. In one embodiment, the crystalline material comprises silicon. Other types of crystalline material may also be useful. For example, the fin structure may comprise SiGe, Ge or GaAs or a combination of the various crystalline materials, including silicon.

In some embodiments, the device of FIGS. 4a-c may be provided with a hard mask layer, as described in FIGS. 2a-c, to provide a transistor with a double gate or a counter doped well, as described in FIGS. 3a-c, or a combination thereof.

Figure 5A:
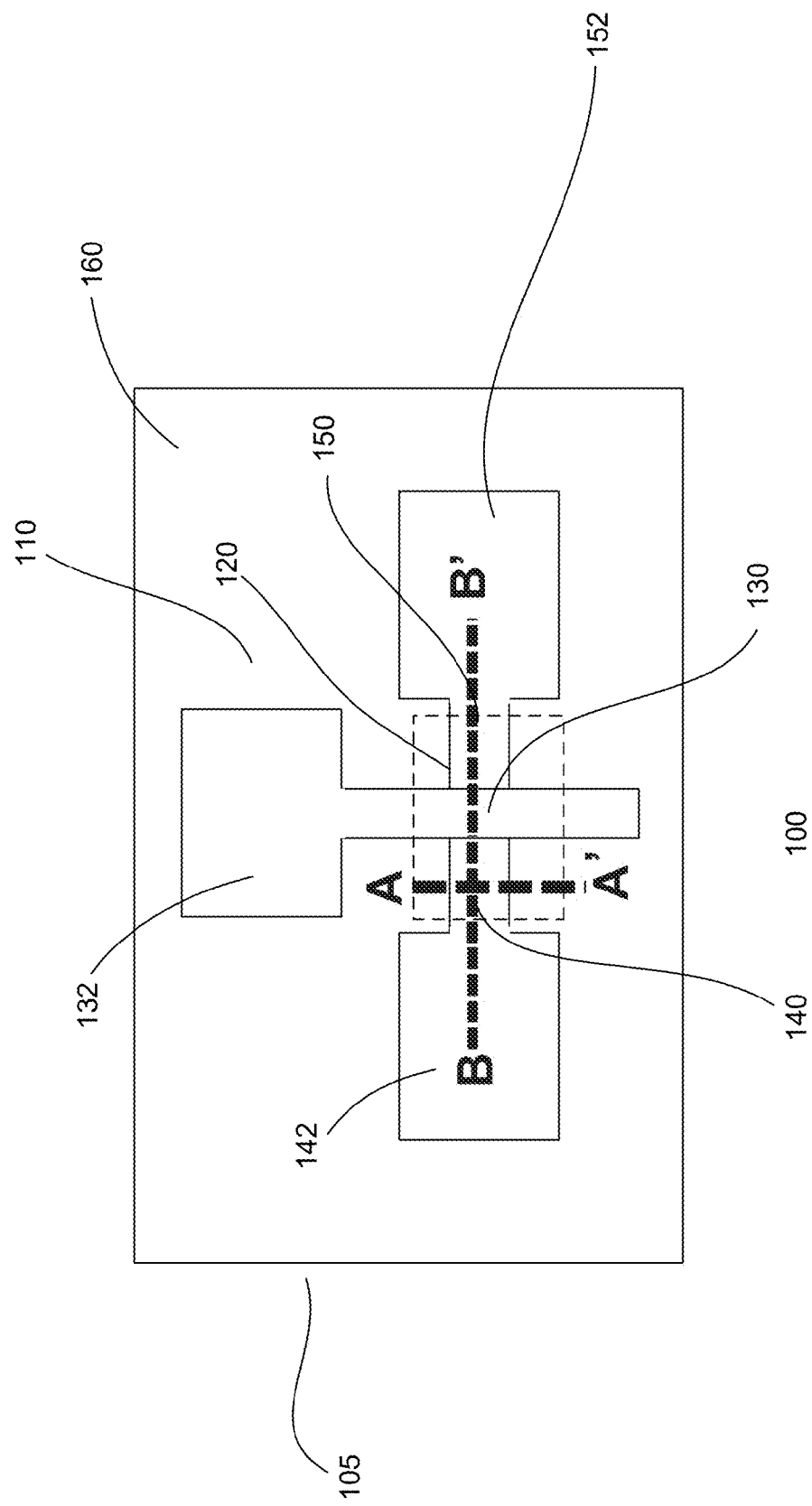
FIGS. 5a-c show various views of an alternative embodiment of a device.
Figure 5B:
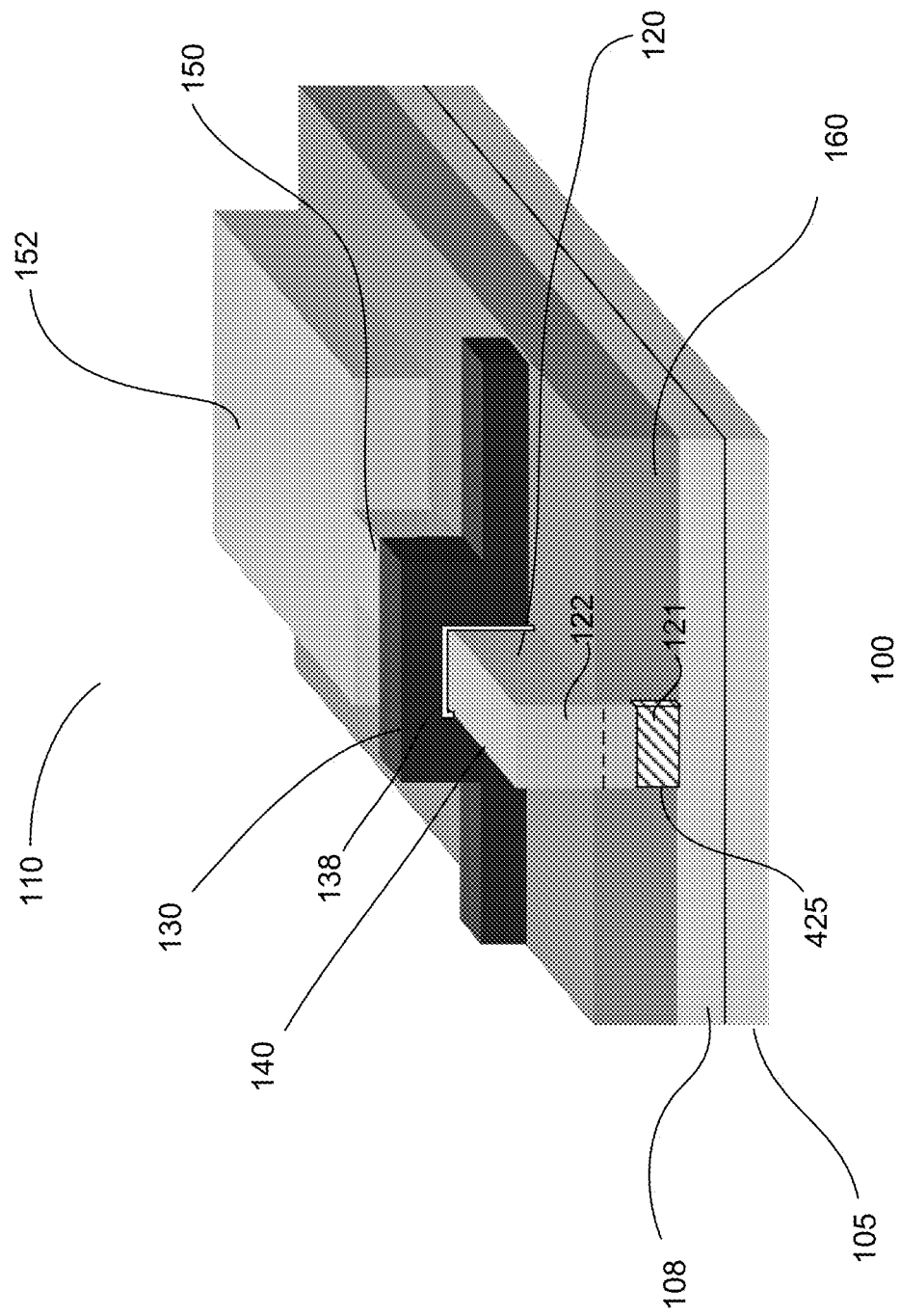
Figure 5C:
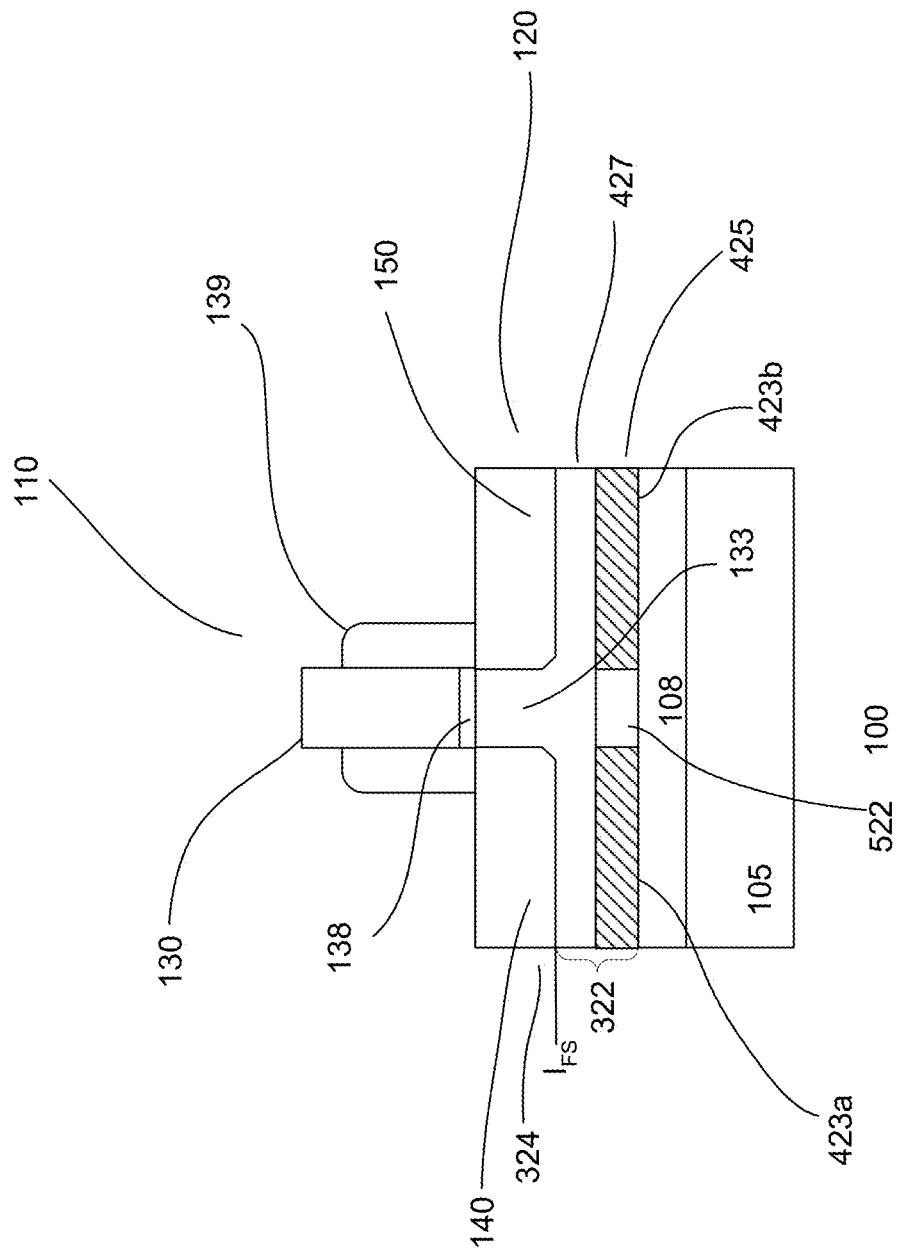

FIGS. 5a-c show various views of another embodiment of a device 100. FIG. 5a shows a top view while FIG. 5b shows a 3-dimensional view of the device along A-A' and FIG. 5c shows a cross-sectional view of the device along B-B'. The device, for example, comprises an IC. Other types of devices may also be useful. The device shown in FIGS. 5a-c is similar to that shown in FIGS. 4a-c. As such, the common features need not be discussed.

In one embodiment, the fin structure 120 is divided into first and second portions (121, 122), with the second portion being disposed above the first portion. In one embodiment, the S/D regions are disposed in the second portion of the fin structure. An interface $I_{FS}$ of the first and second portions, for example, may be located at about the surface of the dielectric layer. This interface, for example, defines the bottoms of the S/D regions. In other embodiments, the interface of the first and second portions may be located at other depths. For example, the interface of the first and second portions may be located above or below the surface of the dielectric layer.

The first portion of the fin structure, in one embodiment, comprises lower and upper first portions 425 and 427. The lower first portion may serve as a bottom portion of the fin structure while the upper first portion may serve as an intermediate portion between the first lower portion and the second portion of the fin structure. In one embodiment, the lower first portion 425 comprises first and second counter doped regions 423a-b. The first and second counter doped regions are disposed in the lower first portion below the S/D regions, separated below the channel. The counter doped regions may also be disposed below the S/D contact regions. This, for example, produces a SDODEL device.

The counter doped regions comprise first polarity type dopants, which is the same polarity type as the S/D regions. In one embodiment, the counter doped regions may be a lightly to intermediately doped regions. For example, the dopant concentration of the counter doped regions may be about $1E10^{18}$ atoms/cm$^3$. Other dopant concentrations may also be useful. In one embodiment, the dopant concentration is consistent throughout the counter doped regions. For example, no tailing off of dopants occur at or near the bottom of the counter doped regions. This reduces RDF.

The intermediate or upper first portion separates the counter doped regions from the S/D regions. In one embodiment, the intermediate portion serves as a depletion region between the S/D regions and counter doped regions. The height of the intermediate portion should be selected to enable the depletion region of the S/D drain regions to merge with the depletion region of the counter doped regions at zero bias between the S/D regions and the counter doped regions. For example, the height of the intermediate portion or distance between the S/D regions and counter doped regions should be selected to provide a depletion region which is fully depleted at zero bias between the S/D regions and counter doped regions. The height of the intermediate portion may depend on the doping of the counter doped regions and the S/D regions. The height of the intermediate portion can be tuned based on the doping of the S/D regions and counter doped regions to provide a fully depleted region between the S/D regions and the counter doped regions.

By providing counter doped regions, the depletion regions of the S/D regions can be extended deeper to increase their widths. Increasing the widths of the depletion regions reduces the junction capacitance $C_j$ of the device. The larger the separation between the counter doped region and the S/D regions while maintaining the merger of the depletion regions, the greater the reduction in Cj. Preferably, the thickness of the intermediate portion should be as large as possible while maintaining the merger of the depletion regions to produce the largest depletion width for the greatest reduction in $C_j$.

The counter doped regions provide flexibility in designing S/D regions. The interface of the upper and lower regions, which defines the bottom of the S/D regions, can be designed with greater flexibility while increasing the widths of the depletion regions. For example, adjusting the height of the counter doped regions may increase or decrease the depth of S/D regions while maintaining a fully depleted depletion region between the S/D regions and counter doped regions. For example, S/D regions having shallower depths may be provided by increasing the height of the counter doped regions or deeper S/D regions may be provided by decreasing the height of the counter doped regions.

In some embodiments, the device of FIGS. 5a-c may be provided with a hard mask layer, as described in FIGS. 2a-c, to provide a transistor with a double gate or a counter doped well, as described in FIGS. 3a-c, or a combination thereof.

Figure 6B:
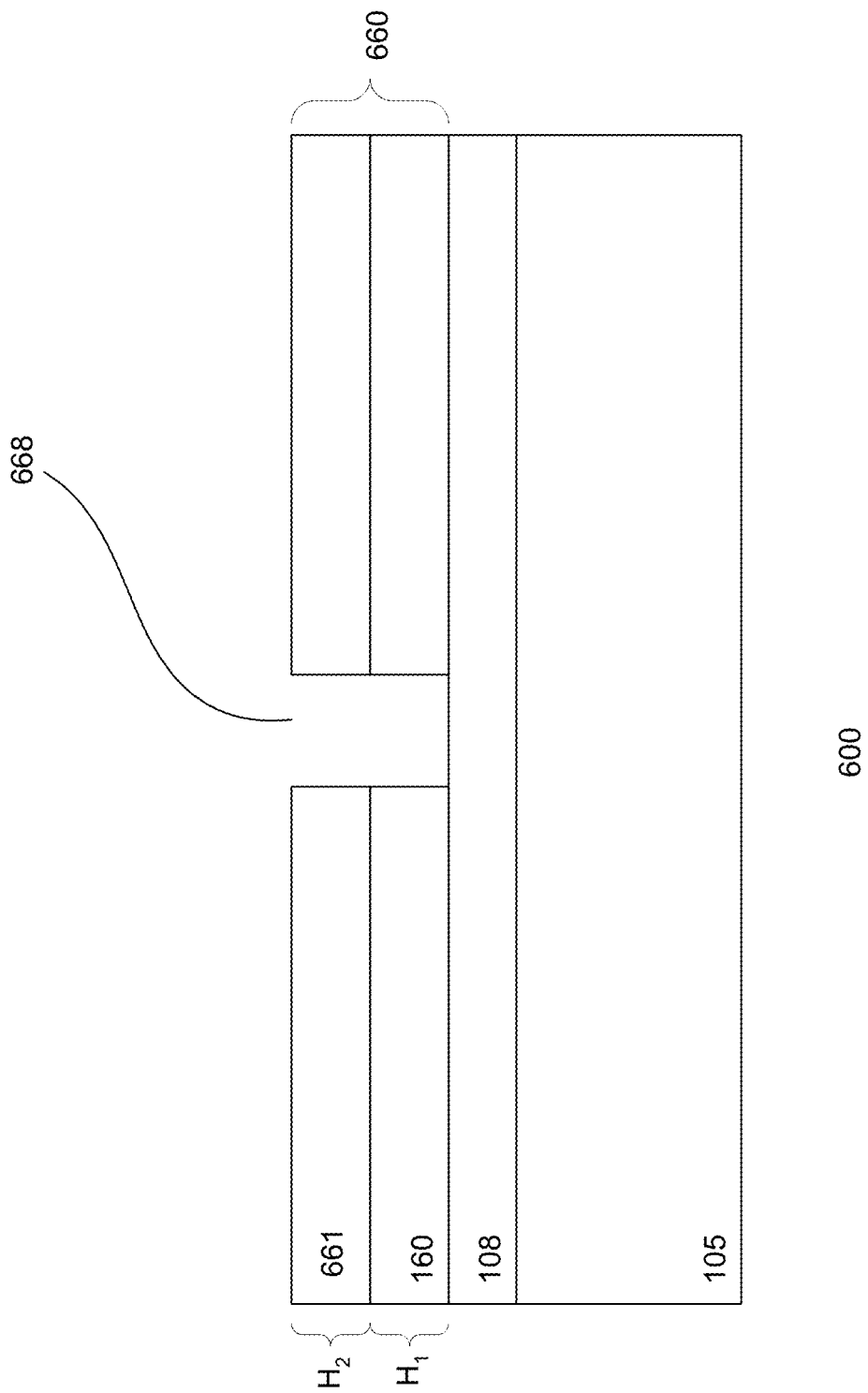

FIGS. 6a-g show cross-sectional views of an embodiment of a process 600 for forming a device or IC. Referring to FIG. 6a, a substrate 105 is provided. The substrate can comprise a silicon substrate, such as a lightly p-type doped substrate. Other types of substrates, including SiGe, Ge and group III-V semiconductors such as GaAs, InP and InAs, are also useful.

The substrate may be prepared with a device region. The device region, for example, serves as a region for a transistor. In one embodiment, the device region serves as a region for a finFET. Although the substrate is described with one device region, it is understood that the substrate may include numerous device regions (not shown). The numerous device regions may include different types of device regions. For example, the substrate may include other device regions for memory cells and logic devices. The logic regions, for example, may include regions for devices, such as support devices for accessing the memory array. Additionally, the logic regions may include other types of devices, depending on the type of IC formed. The logic region, for example, may include regions for different voltage devices. For example, the logic region may include regions for high voltage devices, medium voltage devices, low voltage devices or a combination thereof. Other configurations of logic regions may also be useful.

A doped isolation well 108 is formed in the device region. The isolation well, in one embodiment, comprises dopants of a second polarity type. The depth of the doped well, for example, may be about 0.05-0.5 μm. The doped well may also have other depths. The dopant concentration of the isolation well may be about $10^{16}$-$10^{19}$ atoms/cm$^3$. Providing isolation wells having other depths and/or concentrations may also be useful. The doped well having second polarity type dopants is used for a first polarity type device. In one embodiment, the doped well comprises a p-type doped well for a n-type device.

Alternatively, the doped well comprises an n-type doped well to form a p-type device. The doped well may be formed by implanting appropriate dopants with the desired dose and energy into the substrate. The dopant type, dose and power may depend on the type of device to be formed. The doped well serves to isolate, for example, a device with a first polarity type channel from a device with a second polarity type channel. For example, a p-type doped isolation well isolates a n-type channel device from a p-type channel device or a n-type doped isolation well isolates a p-type channel device from a n-type channel device.

In one embodiment, the isolation well comprises a p-well for a n-type device. Forming a n-well for a p-type device may also be useful. The isolation well may be formed by ion implantation. For example, single or multiple implants may be performed to form the isolation well. In some embodiments, two implants may be performed to form the isolation well. Forming the isolation well using other number of implants may also be useful. Other techniques for forming the isolation well may also be employed.

The substrate may include other types of device regions for other types of devices. For example, the substrate may include p-type and n-type devices, such as high, medium and low voltage p-type and n-type devices. Various types of n-type and p-type wells are provided for these devices. The various wells may be formed by separate implantation processes using implant masks. P-type dopants can include boron (B), aluminum (Al), indium (In) or a combination thereof, while n-type dopants can include phosphorus (P), arsenic (As), antimony (Sb) or a combination thereof.

A dielectric layer 660 is formed on the substrate. The dielectric layer comprises a dielectric stack with a plurality of dielectric sub-layers. In one embodiment, the dielectric stack comprises first and second dielectric sub-layers 160 and 661. The first dielectric sub-layer, for example, is a lower dielectric sub-layer and the second dielectric sub-layer is the upper dielectric sub-layer of the stack. The dielectric sub-layers comprise materials which can be removed selectively to each other. In one embodiment, the first dielectric sub-layer comprises silicon oxide while the second dielectric sub-layer comprises silicon nitride. In other embodiments, the first dielectric sub-layer may comprise silicon nitride and the second dielectric sub-layer comprises silicon oxide. Other types of dielectric layers or stack may also be useful.

The lower dielectric sub-layers may comprise a plurality lower dielectric sub-layers. In some cases, the upper dielectric sub-layer may include a plurality of upper dielectric sub-layers. This provides a dielectric layer having more than first and second sub-layers. In such cases, the dielectric sub-layers at the interface of the upper and lower dielectric sub-layer are of different materials, with the one below serving as an etch stop layer.

In one embodiment, the lower dielectric sub-layer comprises a second lower dielectric sub-layer over a first lower dielectric sub-layer. The second lower dielectric sub-layer may serve as the etch stop layer. The first lower dielectric sub-layer may comprise the same or different material as the upper dielectric sub-layer so long as the second lower dielectric sub-layer is different from the upper dielectric sub-layer. In one embodiment, the lower dielectric sub-layer comprises a nitride layer over an oxide layer while the upper dielectric sub-layer is an oxide layer, forming an oxide/nitride/oxide dielectric stack. The nitride may serve as a protective layer to prevent excessive removal of oxide from, for example, a HF clean. Other configurations of the dielectric layer may also be useful.

The overall height of the dielectric layer $H_T$ is equal to $H_1 + H_2$, where $H_1$ is the thickness of the lower dielectric sub-layer and $H_2$ is the thickness of the upper dielectric sub-layer. In one embodiment, $H_2$ determines the height of the device. For example, $H_2$ determines the height of the fin type device. The height $H_2$ may be equal to about 10-100 nm. In other embodiments, $H_2$ may be about 20-80 nm or 20-50 nm. As for $H_1$, it may be about 30-500 nm. In other embodiments, $H_1$ may be about 30-100 nm. Other values for $H_1$ and $H_2$ may also be useful. For example, the values of $H_1$ and $H_2$ may be selected based on design requirements. In the case where the lower dielectric sub-layer includes multiple layers, the total thickness of the lower dielectric sub-layers may be $H_1$. In the case where the upper dielectric sub-layer includes multiple layers, the total thickness of the upper dielectric sub-layers may be $H_2$. Other configurations of the heights of the upper and lower dielectric sub-layers may also be useful. In some embodiments, the interface of $H_1$ and $H_2$ is employed to determine the height of the device.

Referring to FIG. 6b, the dielectric layer is patterned to form an opening 668, exposing the substrate. The opening corresponds to a fin which is to be formed on the substrate. In one embodiment, the opening includes the S/D contact pads at ends of the fin. Patterning of the opening may be achieved using mask and etch techniques. For example, a mask, such as photoresist, may be selectively patterned to create an opening to expose a portion of the dielectric layer corresponding to the opening. An anisotropic etch, such as a reactive ion etch (RIE), may be performed to remove the exposed portions of the dielectric layer to form the opening. This exposes the substrate in the opening. To improve lithographic resolution, an anti-reflective coating (ARC) can be provided beneath the photoresist. Other techniques for patterning the dielectric layer may also be useful. After patterning the dielectric layer, the mask, including ARC layer may be removed.

Figure 6C:
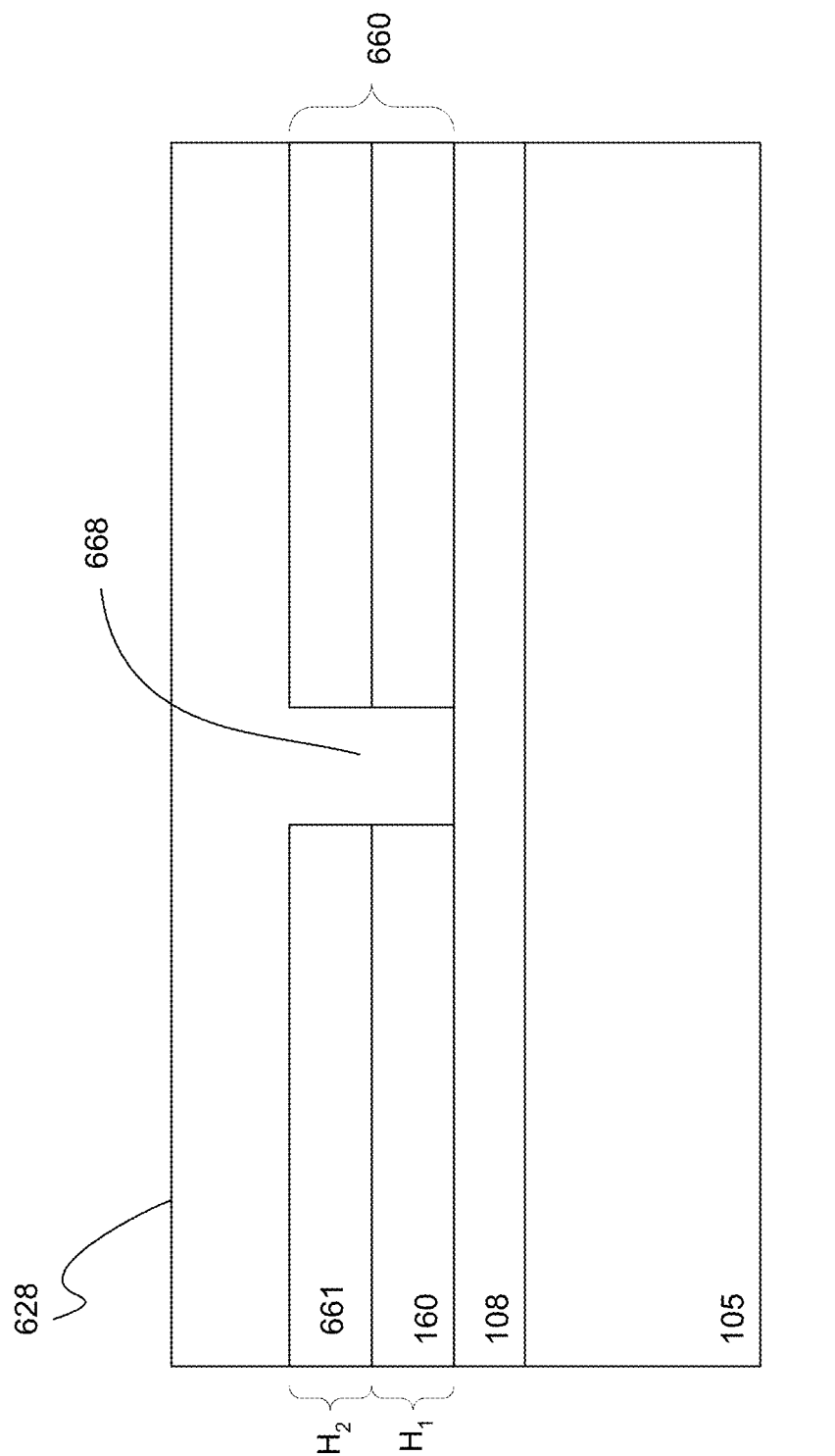

The opening is filled with fin layer 628 used to form the fin, as shown in FIG. 6c. In one embodiment, the fin layer comprises a semiconductor material. Preferably, the semiconductor material has good or potential to have good carrier mobility. For example, the opening is filled with a crystalline material or a material which can be crystallized. Preferably, the opening is filled with a single crystalline semiconductor material or a semiconductor material which can be crystallized to be a single or substantially single crystalline material. In other embodiments, the opening may be filled with a polycrystalline material. In one embodiment, the opening is filled with silicon. Other types of semiconductor material may also be useful. For example, the opening may be filled with SiGe, Ge or GaAs or a combination of the various crystalline materials.

In other embodiments, the opening may be filled with a polycrystalline or an amorphous material. A polycrystalline or amorphous fin structure may be useful for thin film applications.

In one embodiment, a semiconductor layer is formed on the substrate to fill the opening and cover the dielectric layer. The semiconductor layer comprises amorphous silicon. The amorphous silicon layer, for example, is deposited by chemical vapor deposition (CVD). Other types of semiconductor layer or deposition techniques may also be useful.

In FIG. 6d, excess material of the semiconductor layer is removed. For example, the excess material over the dielectric layer and above the opening is removed. Removing the excess material, in one embodiment, comprises a planarizing process, such as chemical mechanical polishing (CMP). Other types of planarizing processes may also be useful. For example, a reflow process may be employed. The planarizing process forms a planar top surface between the dielectric layer and semiconductor material filling the opening. This forms a fin 120. In one embodiment, this forms a fin with contact pads.

The amorphous silicon layer is annealed to form a crystalline silicon layer. The anneal, for example, recrystallizes the amorphous silicon layer to form a single or substantially single crystalline silicon layer. Various types of anneals may be employed. For example, the anneal could be a thermal anneal, a rapid thermal anneal (RTA) or a laser anneal. In one embodiment, the anneal may be performed at a temperature of 600-800° C. for about 10-30 minutes. This results in a crystalline fin. In one embodiment, a crystalline fin with contact pads is formed. In some cases, the fin layer may be a polycrystalline or an amorphous material.

The amorphous layer, in some embodiments, may be recrystallized prior to removing excess material to form a planar surface with the surface of the dielectric layer.

In alternative embodiments, the opening is filled with a crystalline semiconductor material. In one embodiment, the opening is filled with an epitaxial layer. The epitaxial layer may be formed by selective epitaxial growth (SEG). For example, the opening is filled with an epitaxial silicon layer by SEG. In some embodiments, other types of epitaxial layers, such as SiGe, Ge, GaAs or GaN may be used. The SEG layer may be formed to provide a planar surface with the top of the dielectric layer. In other embodiments, the SEG layer may be formed, for example, slightly below the top surface of the dielectric layer.

SEG can be used to control the height of the upper portion of the layer above the interface of $H_1$ and $H_2$. In the case where it is coplanar or substantially coplanar with the top surface of the dielectric layer, the height is equal to about $H_2$. Alternatively, for the case where it is below the top surface of the dielectric layer, the height is equal to the growth of the epitaxial layer above the interface of $H_1$ and $H_2$.

In one embodiment, the epitaxial layer is formed with over growth above the top surface of the dielectric layer. The over growth may be removed by, for example, CMP to form a coplanar surface with the dielectric layer. This enables $H_2$ to define the height of the device. In some other embodiments, CMP may be employed for the case without over growth. For example, CMP may be employed for the case where the SEG layer is grown to or below the top surface of the dielectric layer. It is, however, understood that CMP is not necessary for such embodiments. In the case where the SEG layer is formed with a top surface below the top surface of the dielectric layer, the height of the device is determined by the interface of $H_1$ and $H_2$ as well as the growth of the SEG layer.

In other embodiments, the fin structure may be formed with a combination of epitaxial and recrystallized materials. For example, the epitaxial layer is formed in a lower portion of the fin structure and a recrystallized material is formed in the upper portion of the fin structure. Forming a fin structure with other configurations of epitaxial and recrystallized material may also be useful.

Referring to FIG. 6e, the second dielectric sub-layer is removed selective to the first dielectric sub-layer. This leaves the first dielectric sub-layer 160 on the substrate. The selective removal of the second dielectric sub-layer may be achieved, for example, by a wet etch. Other techniques, including an anisotropic etch, such as RIE, may also be employed. The selective removal of the second dielectric sub-layer leaves the first dielectric sub-layer with a non-selectively etched top surface.

A portion of the fin extends above the first dielectric sub-layer. For example, the height of the portion of the fin extending above the first dielectric sub-layer determines the device height. The height of the device may be equal to $H_2$ or other heights. For example, the height of the device may be determined by SEG of the fin structure or by over polishing of the fin structure. An anneal may be optionally performed after removing the second dielectric sub-layer. The anneal, for example, is performed in a hydrogen ($H_2$) ambient to smoothen the fin and passivate dangling bonds. Other types of anneals may also be useful.

Figure 6F:
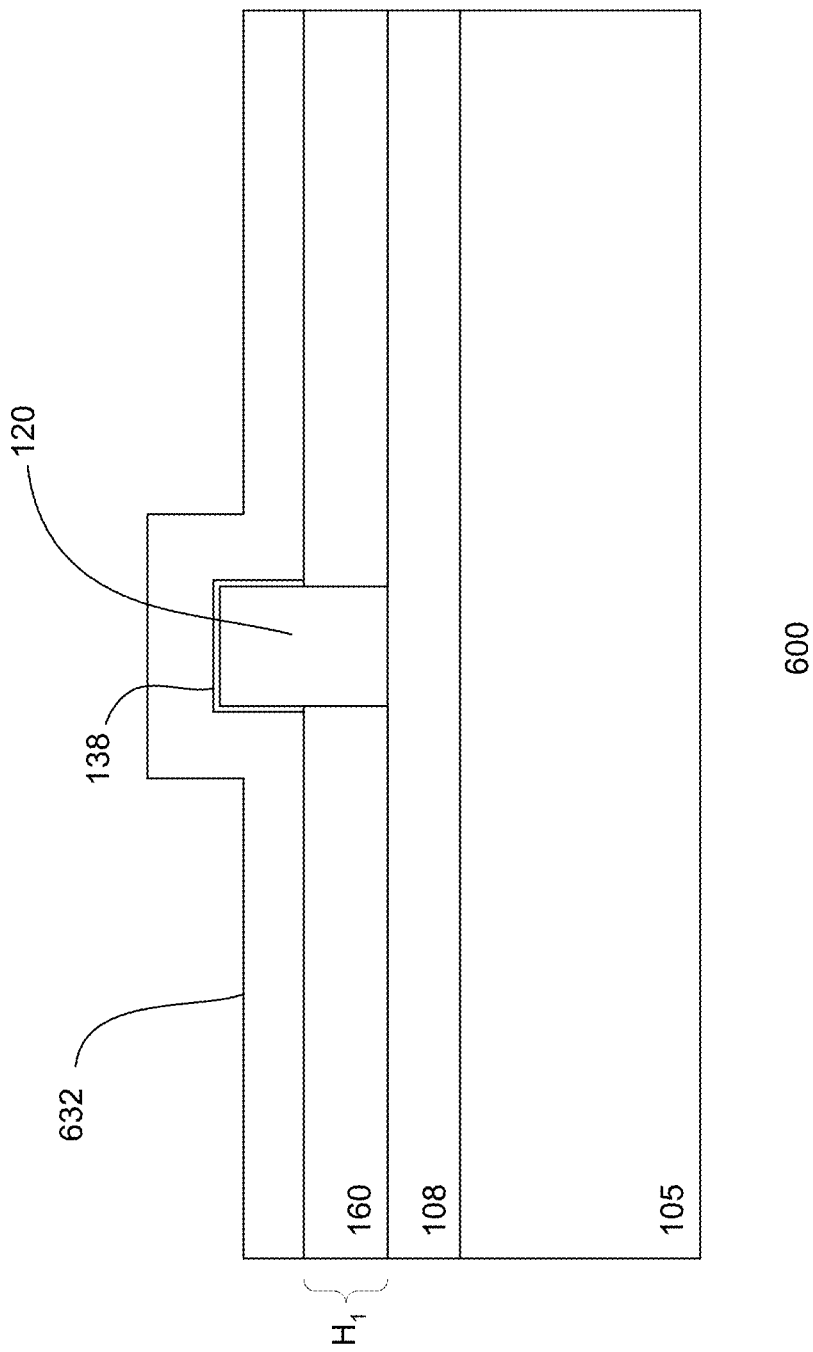

As shown in FIG. 6f, a gate oxide layer 638, in one embodiment, is formed on the exposed surfaces of the fin structure, including the contact pads. The gate oxide layer, for example, comprises silicon oxide. In one embodiment, the gate oxide layer is formed by thermal oxidation. The thermal oxidation may be performed in an oxidizing ambient, such as $O_2$. The oxidizing ambient may also include $N_2$. This forms a thermal silicon oxide layer on the surfaces of the fin structure. Forming other types of gate oxides or using other techniques to form the gate oxide layer may also be useful. For example, the process of forming a gate oxide may form SiON, $HfO_2$ or HfSiON or other types of gate oxide layer. The thickness of the gate oxide layer may be, for example, about 10-100 Å. Other gate oxide thicknesses may also be useful.

A gate electrode layer 632 is formed on the substrate, covering the dielectric layer and gate oxide layer. The gate electrode layer, for example, comprises polysilicon. The gate electrode layer may be formed by, for example, CVD. The thickness of the gate electrode layer, for example, may be about 400-1000 Å. Other types of gate electrode layers, thicknesses or techniques for forming the gate electrode layer may also be useful. For example, the gate electrode layer may comprise TaN, TiN or other types of gate electrode material or may be formed by techniques such as atomic layered deposition (ALD) or sputtering.

The gate layer may be doped to reduce resistance, adjust $V_T$, adjust work function or a combination thereof. The type of dopants and dopant concentration may be appropriately selected based on the design requirements. The gate layer may be in situ doped during formation or doped by ion implantation after the formation of the gate electrode layer.

Referring to FIG. 6g, the gate electrode layer and gate oxide layer are patterned to form a gate stack having a gate electrode 130 over a gate dielectric 138 which traverses the fin 120. Patterning of the gate electrode layer may also form the gate contact.

Mask and etch techniques may be employed to form the gate stack. For example, a patterned photoresist mask may be used as an etch mask for an RIE to form the gate stack. To improve lithographic resolution, an ARC can be provided beneath the photoresist. Other techniques for patterning the dielectric layer may also be useful. After patterning the substrate to form the gate stack, the mask, including the ARC layer may be removed.

The process continues, for example, to form S/D regions in the fin structure adjacent to the gate. The S/D regions comprise first polarity type dopants. In one embodiment, lightly doped S/D extension regions are formed, for example, by ion implantation. The extensions are formed by, for example, implanting first polarity type dopants. The process parameters of the implantation, such as dose and energy, may be appropriately selected based on design requirements.

After the extension regions are formed, gate sidewall spacers may be formed on sidewalls of the gate. The gate sidewall spacers, for example, comprise silicon nitride. Other types of spacer materials, such as silicon oxide or silicon oxynitride, may also be useful. To form sidewall spacers, a spacer dielectric layer is deposited on the substrate. The spacers can be formed by using various techniques, such as plasma enhanced chemical vapor deposition (PECVD). Other techniques to form the spacer dielectric layer or forming other types of spacers may also be useful. The spacer dielectric layer is subsequently anisotropically etched, such as by RIE, to remove horizontal portions, leaving non-horizontal portions on the sidewalls as the spacers.

Heavily doped S/D regions with first polarity type dopants are formed. The heavily doped S/D regions are formed by, for example, implanting first polarity type dopants. The process parameters of the implantation, such as dose and energy, may be appropriately selected based on design requirements. In some embodiments, the S/D extension regions may be formed along with forming the S/D regions after spacer formation. Silicide contacts may be formed on the contact regions of the device, such as S/D contact regions and gate contacts regions.

The process further continues to form, for example, a dielectric layer. The dielectric layer may be a pre-metal dielectric (PMD) layer. Contacts to the contact pads may be formed in the transistor. Additional processes may include forming of one or more interconnect levels, final passivation, dicing, assembly, packaging and testing. Other processes are also useful. For example, other components, such as low voltage, medium voltage, and high voltage I/O devices can be formed prior to forming the interconnections.

As described, the dielectric layer on the substrate has a non-selectively etched top surface. The dielectric layer with the non-selectively etched top surface enables the top device portion of the fin structures to be more consistent from fin structure to fin structure across the wafer. Since the top portion of the fin structure determines the height of the device, reducing height variation of the top portion of the fin structures results in more consistent device characteristics across the wafer.

Figure 7A:
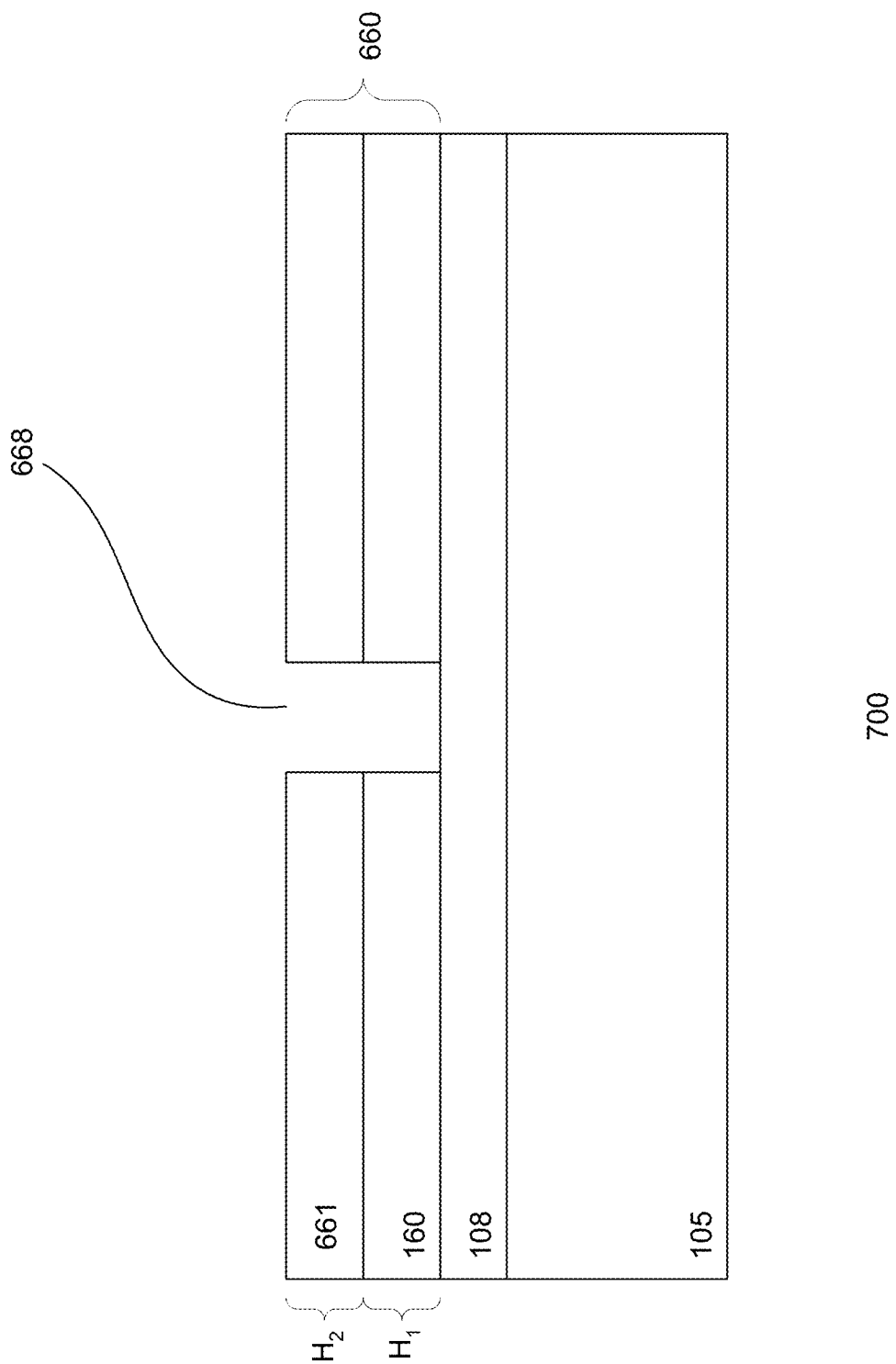
FIGS. 7a-b show cross-sectional views of an embodiment of a process for forming a device.
Figure 7B:
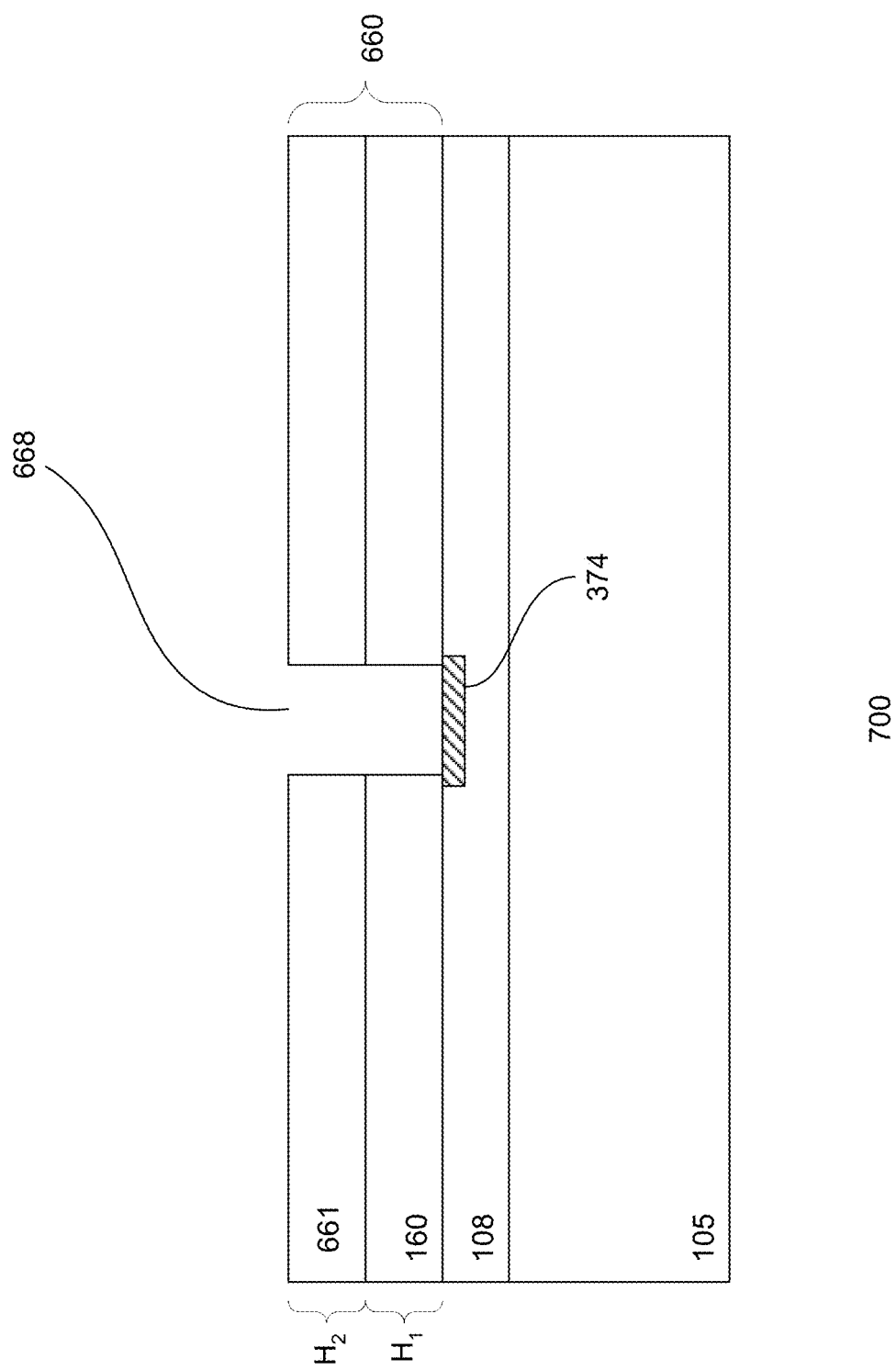

FIGS. 7a-b show cross-sectional views of an embodiment of a process 700 for forming a device or IC. Referring to FIG. 7a, a partially processed substrate 105 is provided. The substrate is at a stage of processing as described in FIG. 6b. As such, the common features need not be discussed. For example, the substrate is prepared with a dielectric stack 660 having an opening 668 corresponding to a fin, for example, with contact pads.

Referring to FIG. 7b, a counter doped well 374 is formed in an upper portion of the isolation well 108 in the substrate 105. The counter doped well comprises first polarity type dopants. The first polarity type is the same polarity type as the subsequently formed S/D regions of the device and is the opposite polarity type of the isolation well. In one embodiment, the counter doped well may be a lightly or intermediately doped well. For example, the dopant concentration of the counter doped well may be about $1E10^{18}$ atoms/cm$^3$. Other dopant concentrations may also be useful.

In one embodiment, the counter doped well is formed by ion implantation. The ion implantation, for example, uses the patterned dielectric stack as an implant mask. The implant parameters may be selected to produce a counter doped well having a desired depth and dopant concentration. The counter doped well, for example, is the substrate below the opening, which is below the subsequently formed fin structure, including the S/D regions and the channel. This, for example, produces a SODEL device.

In an alternative embodiment, an implant mask is provided on the patterned dielectric stack. The implant mask provides openings to the substrate below the S/D regions but protecting the channel region of the device. The ion implantation is performed using the implant mask to form first and second counter doped wells in the substrate below the opening in the dielectric layer, which are separated below the channel region. This forms a SDODEL device. The implant mask, for example, is removed after forming the counter doped wells.

The process continues as described in FIG. 6c and onwards. In one embodiment, the fin structure is divided into first and second portions, with the first portion being below the second portion. The first portion serves as a depletion region separating the counter doped well(s) and the S/D regions of the device. The height of the first portion should be selected to enable the depletion regions of the S/D drain regions to merge with the depletion region(s) of the counter doped well(s) at zero bias. For example, at zero bias between the S/D regions and the counter doped well(s), their depletion regions merge. The height of the first portion may depend on the doping of the counter doped well(s) and the S/D regions. The height of the first portion can be tuned based on the doping of the S/D regions and counter doped well(s) to provide a fully depleted region.

By providing a counter doped well or wells, the depletion regions of the S/D regions can be extended deeper to increase their widths. Increasing the widths the of the depletion regions reduces the junction capacitance $C_j$ of the device. The larger the separation between the counter doped well(s) and the S/D regions while maintaining the merger of the depletion regions, the greater the reduction in $C_j$. Preferably, the thickness of the first portion should be as large as possible while maintaining the merger of the depletion regions to produce the largest depletion width for the greatest reduction in $C_j$.

Figure 8A:
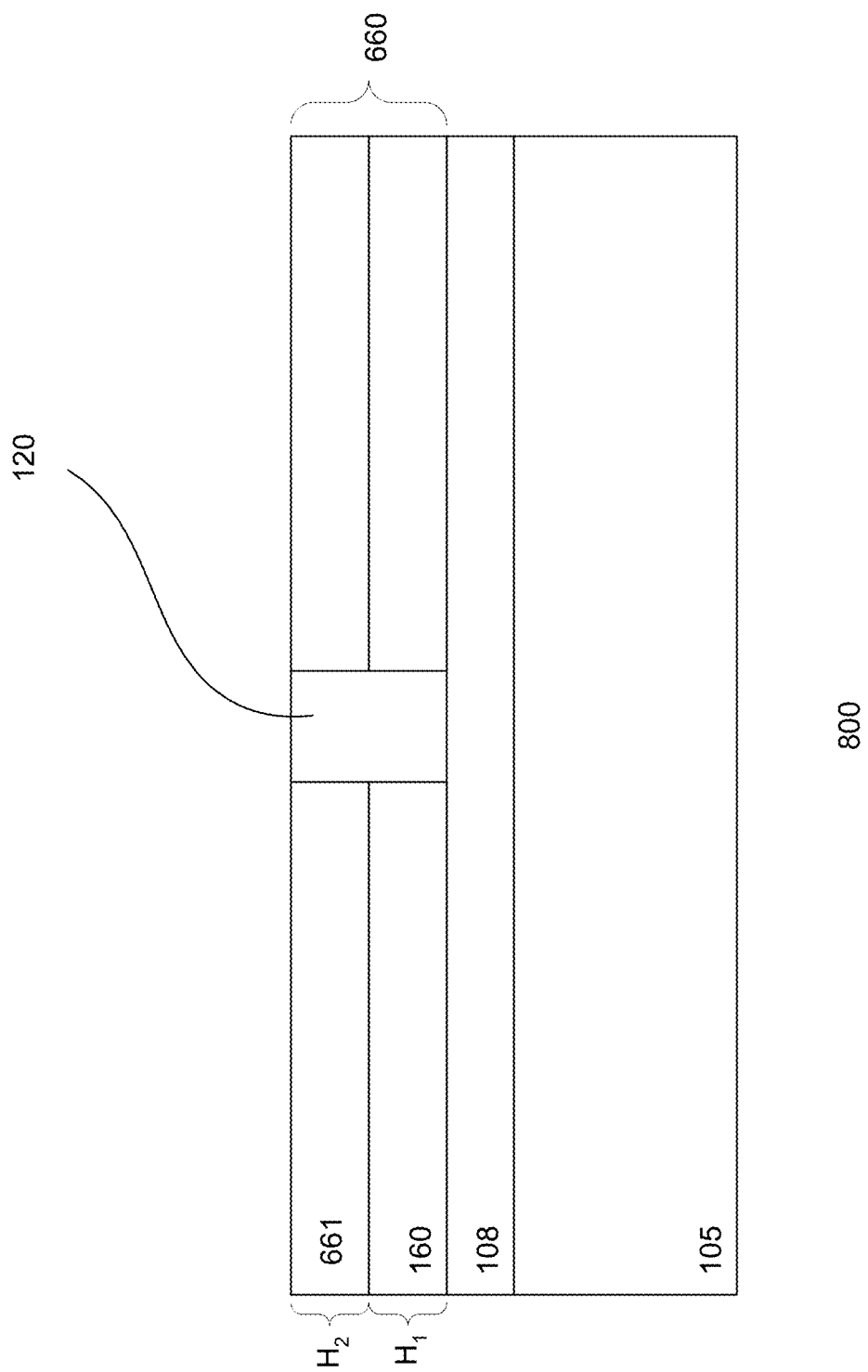
FIGS. 8a-b show cross-sectional views of another embodiment of a process for forming a device.
Figure 8B:
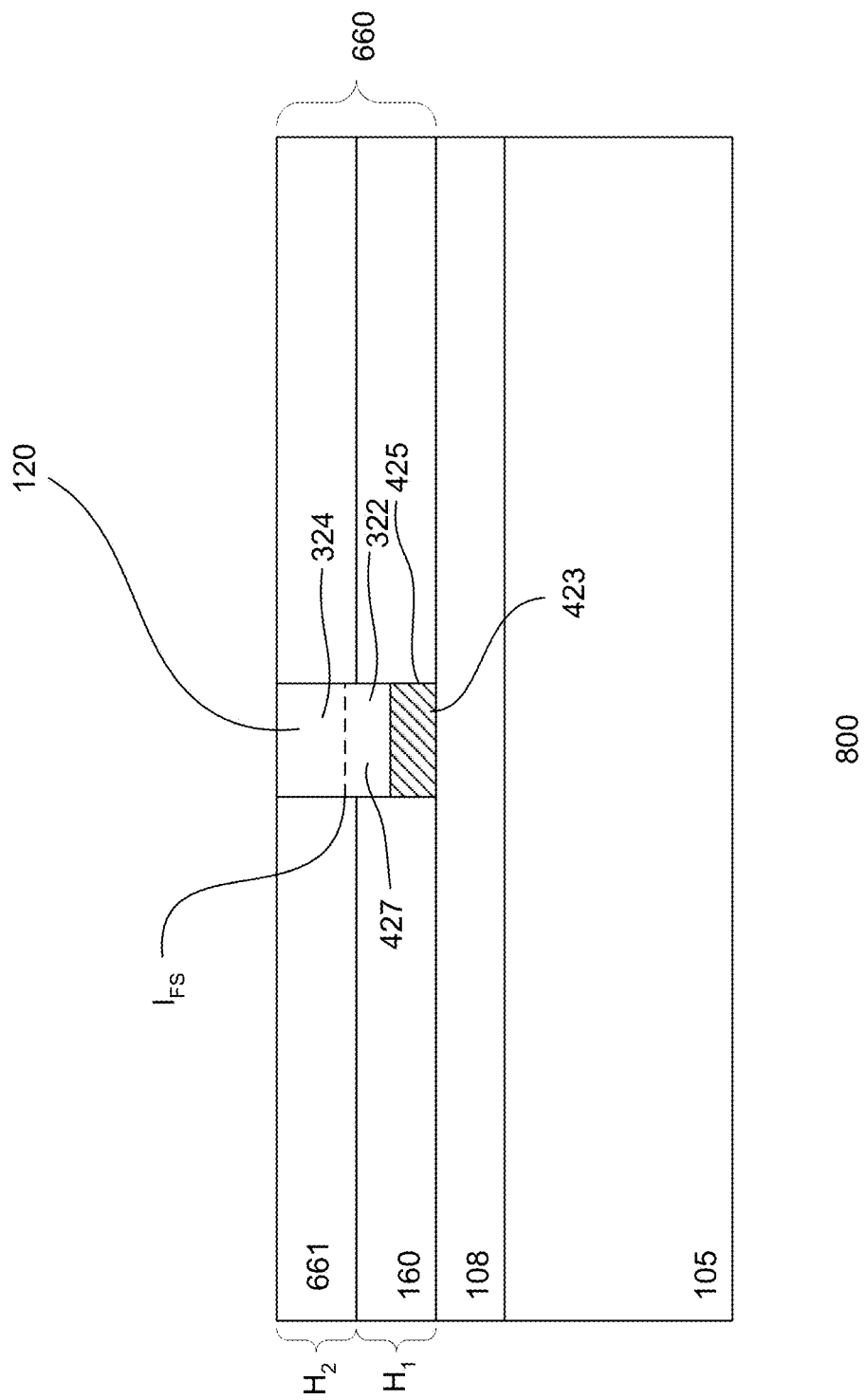

FIGS. 8a-b show cross-sectional views of an embodiment of a process 800 for forming a device or IC. Referring to FIG. 8a, a partially processed substrate 105 is provided. The substrate is at a stage of processing as described in FIG. 6d. As such, the common features need not be discussed. For example, the substrate is prepared with a dielectric stack 660 having a fin structure 120 formed in an opening 668. The fin structure may include S/D contact pads. The fin structure, for example, may comprise a crystalline material. The crystalline material may be epitaxial crystalline material, recrystallized crystalline material or a combination thereof. The fin, as shown, comprises a coplanar top surface with the dielectric layer.

In other embodiments, the fin structure may comprise a polycrystalline or amorphous material. A polycrystalline or amorphous fin structure may be useful for thin film applications.

Referring to FIG. 8b, the fin structure is divided into first and second portions 322 and 324. The first portion, for example is below the second portion. An interface $I_{FS}$ of the first and second portions may define the bottoms of subsequently formed S/D regions. The interface $I_{FS}$ can be disposed at different locations of the fin structure. As shown, $I_{FS}$ may be located above the interface of the first and second dielectric sub-layers 160 and 661. In other embodiments, $I_{FS}$ may be located at or below the interface of the first and second dielectric sub-layers.

The first portion is separated into lower and upper first portions 425 and 427. In one embodiment, a counter doped region 423 is formed in the lower first portion of the first portion of the fin structure. The counter doped region comprises first polarity type dopants, which is the same polarity type as the S/D regions. In one embodiment, the counter doped region may be a lightly to intermediately doped region. For example, the dopant concentration of the counter doped region may be about $1E10^{18}$ atoms/cm$^3$. Other dopant concentrations may also be useful.

In one embodiment, the counter doped region is formed by ion implantation. The dielectric stack may serve, for example, as an implant mask. The implant parameters may be selected to produce a counter region in the lower first portion of the fin structure with the desired dopant concentration. The counter doped region is formed in the lower first portion of the fin structure below the subsequently formed S/D regions and the channel. This, for example, produces SODEL device.

In an alternative embodiment, an implant mask is provided on the dielectric stack and fin structure. The implant mask is patterned to expose the S/D regions while protecting the channel region. The implant mask may also expose the S/D contact regions. The ion implantation is performed using the implant mask to form first and second counter doped regions separated under the channel region. Protecting the channel region of the fin structure from being implanted forms a SDODEL device. The implant mask, for example, is removed after forming the counter doped regions.

The process continues as described in FIG. 6e and onwards. For example, the process includes removing the second dielectric sub-layer 661, forming the gate and S/D regions. Other processes as previously described may also be included.

The upper first portion, for example, is an intermediate region which separates the S/D regions from the counter doped region or regions. The upper first portion, for example, serves as a depletion region in the fin structure between the S/D regions and the counter doped region(s) in the lower first portion. The height of the upper first portion should be selected to enable the depletion regions of the subsequently formed S/D drain regions to merge with the depletion region(s) of the counter doped region(s) at zero bias. For example, at zero bias between the S/D regions and the counter doped region(s), their depletion regions merge. In one embodiment, the height of the upper first portion or distance between the S/D regions and counter doped region(s) should be selected to provide a depletion region which is fully depleted at zero bias. The height of the upper first portion may depend on the doping of the counter doped region(s) and S/D regions. The height of the upper first portion can be tuned based on the doping of the S/D regions and counter doped region(s) to provide a fully depleted region.

By providing a counter doped region or regions, the depletion regions of the S/D regions can be extended deeper to increase their widths. Increasing the widths of the depletion regions reduces the junction capacitance $C_j$ of the device. The larger the separation between the counter doped region(s) and the S/D regions while maintaining the merger of the depletion regions, the greater the reduction in $C_j$. Preferably, the thickness of the upper first or intermediate portion should be as large as possible while maintaining the merger of the depletion regions to produce the largest depletion width for the greatest reduction in $C_j$.

Increased flexibility in designing the S/D regions result from the counter doped region(s). The interface $I_{FS}$ of the first and second regions, which defines the bottom of the S/D regions, can be designed with greater flexibility while increasing the width of the depletion region. For example, adjusting the height of the counter doped region(s) may increase or decrease the depth of S/D regions while maintaining a fully depleted depletion region between the S/D regions and counter doped region(s). For example, S/D regions having shallower depths may be provided by increasing the height of the counter doped region(s) or deeper S/D regions by decreasing the height of the counter doped region(s).

In some embodiments, a counter doped well, as described in FIGS. 7a-b, may be provided before forming the fin structure.

Figure 9A:
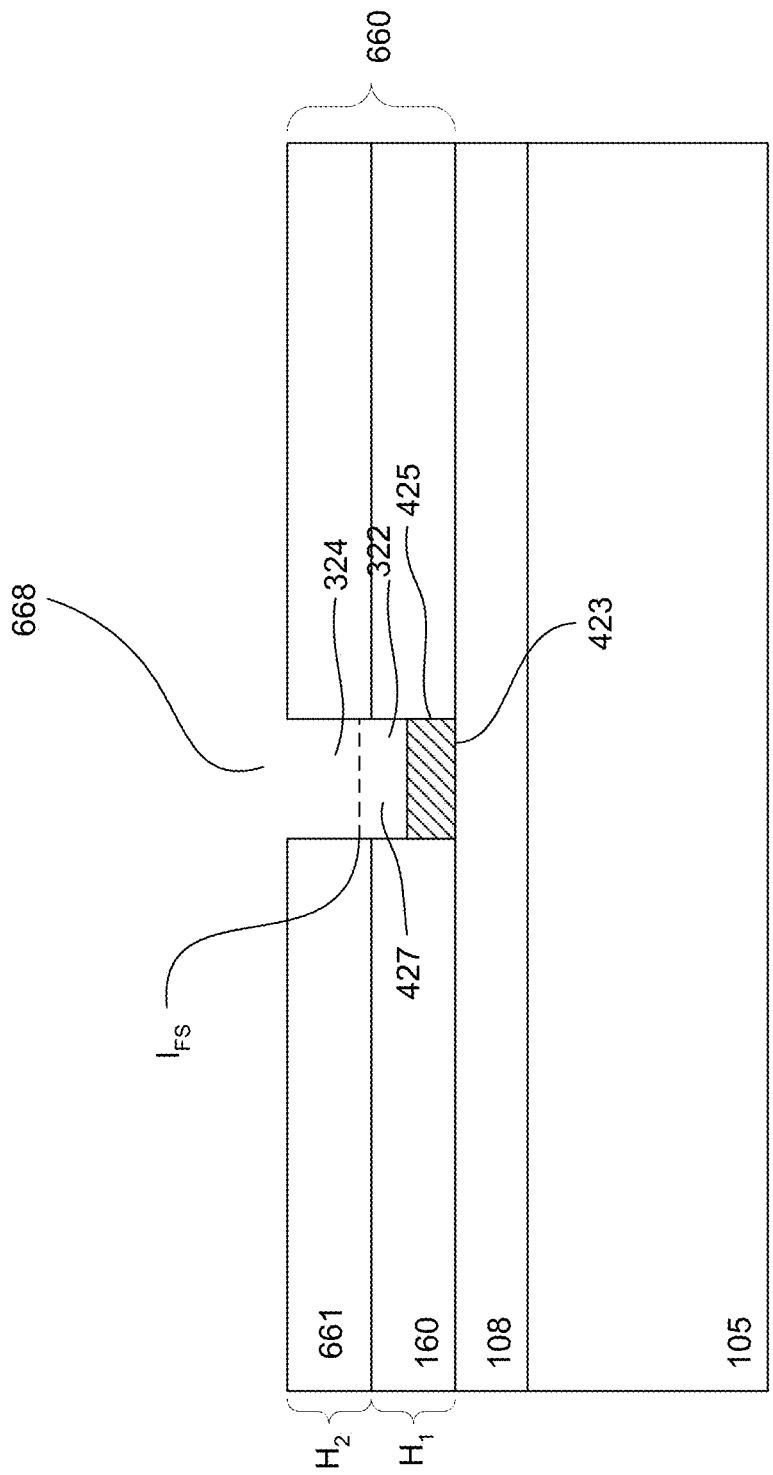
FIGS. 9a-b show cross-sectional views of yet another embodiment of a process for forming a device.
Figure 9B:
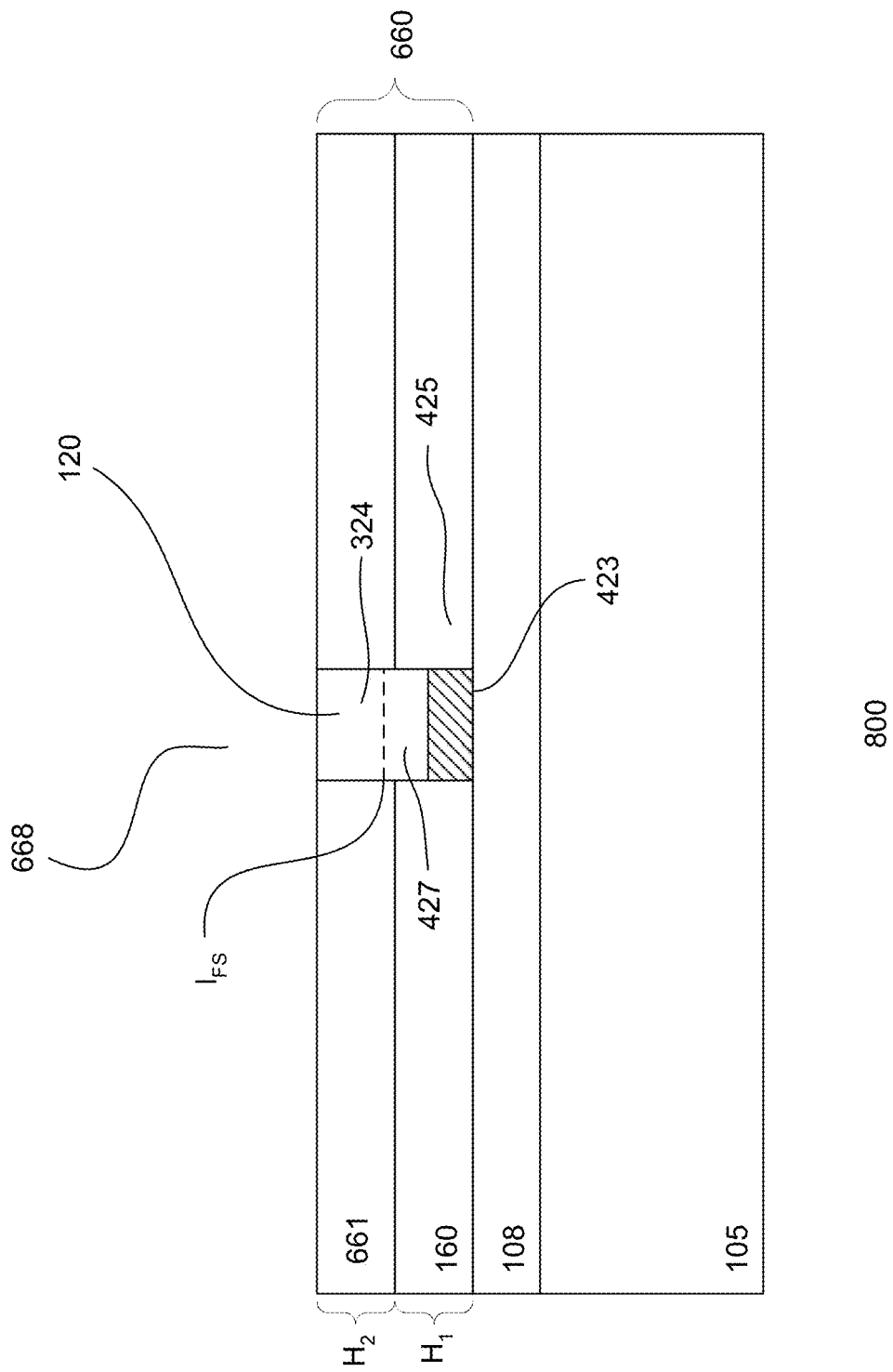

FIGS. 9a-b show cross-sectional views of an embodiment of a process 900 for forming a device or IC. Referring to FIG. 9a, a partially processed substrate 105 is provided. The substrate is at a stage of processing as described in FIG. 6b. As such, the common features need not be discussed. For example, the substrate is prepared with a dielectric stack 660 with an opening 668 corresponding to a fin structure. The opening may include S/D contact pads.

The opening may be virtually divided into first and second portions 322 and 324. The first portion, for example is below the second portion. An interface $I_{FS}$ of the first and second portions may define the bottoms of subsequently formed S/D regions. The interface $I_{FS}$ can be disposed in different locations of the fin structure. As shown, the $I_{FS}$ may be located above the interface of the first and second dielectric sub-layers 160 and 661. In other embodiments, $I_{FS}$ may be located at or below the interface of the first and second dielectric sub-layers. The first portion is separated into lower and upper first portions 425 and 427.

In one embodiment, an epitaxial crystalline layer 423 is formed in the opening in the lower first portion. The epitaxial crystalline layer, in some embodiments, is formed by SEG. The epitaxial crystalline layer is doped with first polarity type dopants, which is the same polarity type as the S/D regions, to form a counter doped region. In one embodiment, the counter doped region may be a lightly to intermediately doped. For example, the dopant concentration of the counter doped region may be about $1E10^{18}$ atoms/cm$^3$. Other dopant concentrations may also be useful.

In one embodiment, the counter doped region may be formed by in situ doping the epitaxial layer. For example, the epitaxial layer is in situ doped as it is formed. Alternatively, the counter doped region may be formed by ion implantation. The dielectric stack may serve, for example, as an implant mask. The implant parameters may be selected to produce a counter region in the lower first portion of the fin structure with the desired dopant concentration. The counter doped region is formed in the epitaxial layer, which is disposed below subsequently formed S/D regions and channel of the device. The counter doped region may also be formed below the subsequently formed S/D contact region. This, for example, produces a SODEL device.

In an alternative embodiment, an implant mask is provided on the dielectric stack and undoped epitaxial layer 423. The implant mask is patterned to expose the S/D regions while protecting the channel region. The implant mask may also expose the S/D contact regions. The ion implantation is performed using the implant mask to form first and second counter doped regions below subsequently formed S/D regions and not the channel region. Protecting the channel region of the fin structure from being implanted with dopants forms a SDODEL device. The implant mask, for example, is removed after forming the counter doped regions.

By in situ doping the epitaxial layer in the lower first portion of the opening or implanting it with dopants after it is formed produces a dopant concentration that is consistent throughout the counter doped region(s). For example, no tailing off of dopants occurs at or near the bottom of the counter doped region(s). This reduces RDF.

In some embodiments, a counter doped well, as described in FIGS. 7a-b, may be provided before forming the fin structure.

In FIG. 9b, the process continues to complete formation of the fin structure. For example, the fin structure in the upper first portion and second portion of the opening is formed. The remaining portion of the fin structure may include epitaxial crystalline material, recrystallized crystalline material or a combination thereof, as described in, for example, FIGS. 6c-d. For example, the upper first portion and second portion may be epitaxial crystalline material, the upper first portion and second portion may be recrystallized crystalline material, or the upper first portion may be epitaxial crystalline material and the second portion may be recrystallized crystalline material. Other configurations of crystalline material for the fin structure may also be useful.

The process continues as described in FIG. 6e and onwards. For example, the process includes removing the second dielectric sub-layer 661, forming the gate and S/D regions. Other processes as previously described may also be included.

The upper first portion, for example, is an intermediate region which separates the S/D regions from the counter doped region(s). The upper first portion, for example, serves as a depletion region in the fin structure between the S/D regions and the counter doped region(s) in the lower first portion. The height of the upper first portion should be selected to enable the depletion regions of the subsequently formed S/D drain regions to merge with the depletion region(s) of the counter doped region(s) at zero bias. For example, at zero bias between the S/D regions and the counter doped region(s), their depletion regions merge. In one embodiment, the height of the upper first portion or distance between the S/D regions and counter doped region(s) should be selected to provide a depletion region which is fully depleted at zero bias. The height of the upper first portion may depend on the doping of the counter doped region(s) and S/D regions. The height of the upper first portion can be tuned based on the doping of the S/D regions and counter doped region(s) to provide a fully depleted region.

By providing a counter doped region or regions, the depletion regions of the S/D regions can be extended deeper to increase their widths. Increasing the widths the of the depletion regions reduces the junction capacitance $C_j$ of the device. The larger the separation between the counter doped region(s) and the S/D regions while maintaining the merger of the depletion regions, the greater the reduction in $C_j$. Preferably, the thickness of the upper first or intermediate portion should be as large as possible while maintaining the merger of the depletion regions to produce the largest depletion width for the greatest reduction in $C_j$.

Increased flexibility in designing the S/D regions result from the counter doped region(s). The interface $I_{FS}$ of the first and second regions, which defines the bottom of the S/D regions, can be designed with greater flexibility while increasing the width of the depletion region. For example, adjusting the height of the counter doped region(s) may increase or decrease the depth of S/D regions while maintaining a fully depleted depletion region between the S/D regions and counter doped region(s). For example, S/D regions having shallower depths may be provided by increasing the height of the counter doped region(s) or deeper S/D regions by decreasing the height of the counter doped region(s).

Figure 10A:
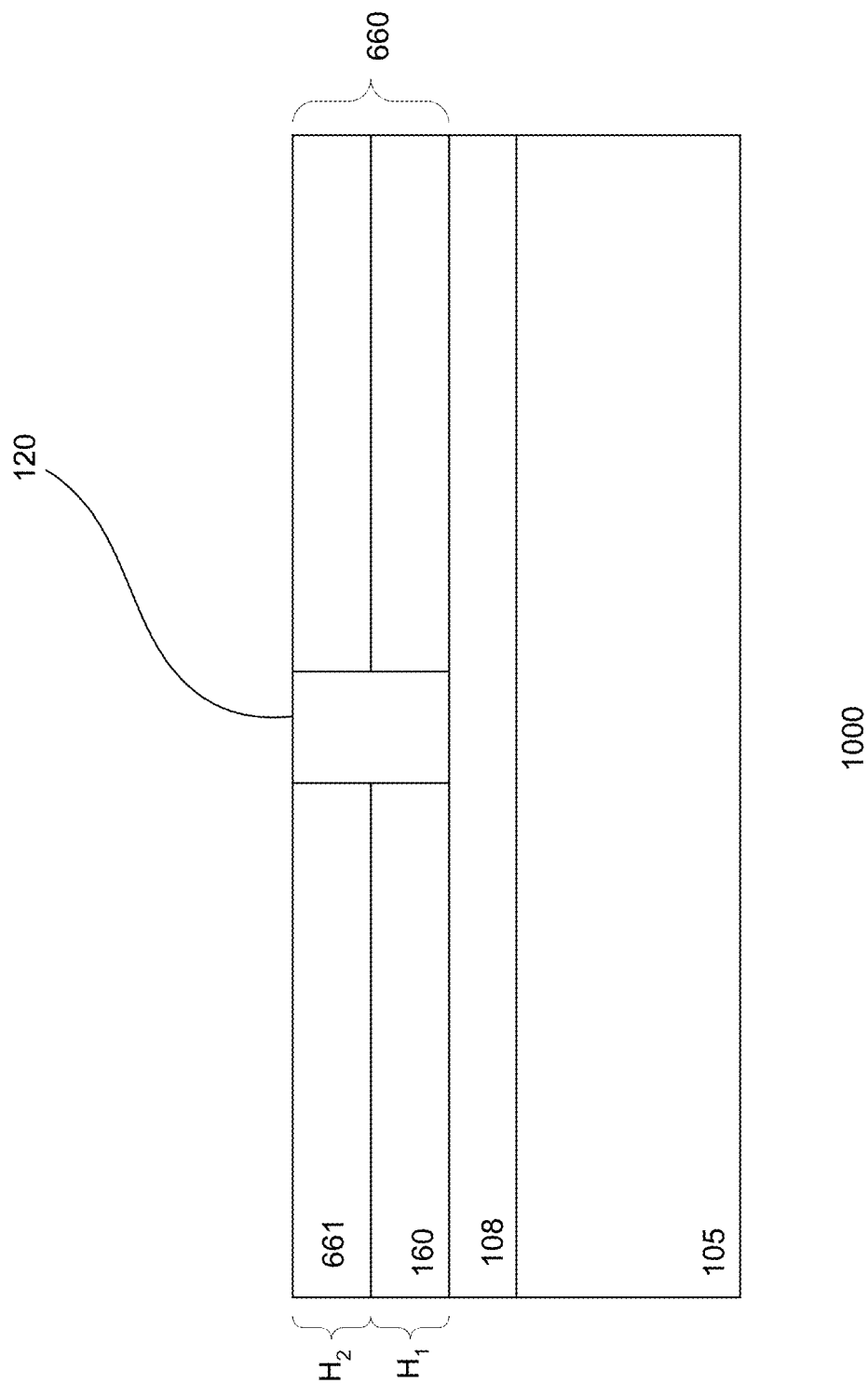
FIGS. 10a-c show cross-sectional views of another embodiment of a process for forming a device.
Figure 10B:
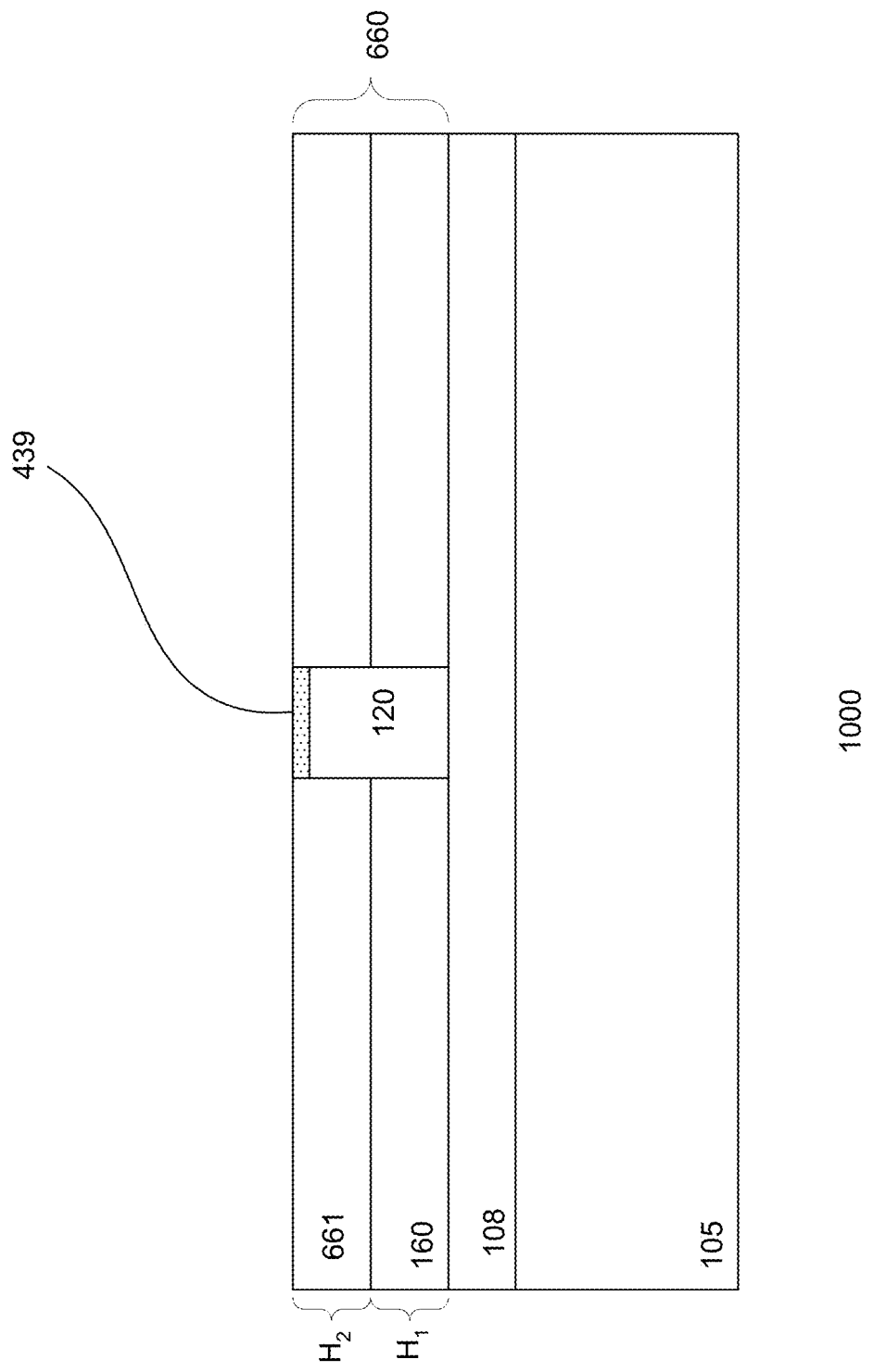
Figure 10C:
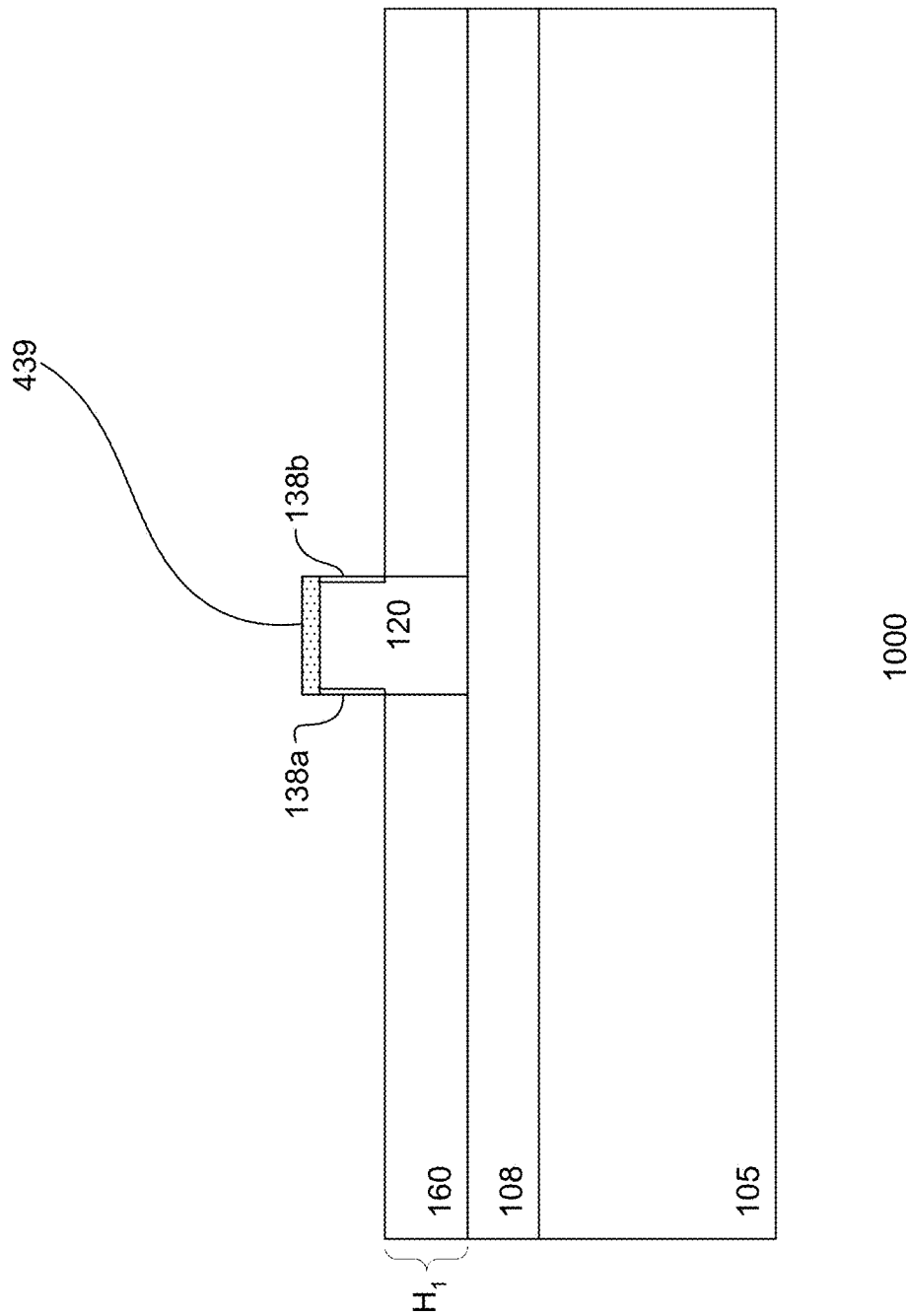

FIGS. 10a-c show cross-sectional views of an embodiment of a process 1000 for forming a device or IC. Referring to FIG. 10a, a partially processed substrate 105 is provided. The substrate is at a stage of processing as described in FIG. 6d. As such, the common features need not be discussed. For example, the substrate is prepared with a dielectric stack 660 having a fin structure 120 formed in an opening 668. The fin structure may include S/D contact pads. The fin structure, for example, may comprise a crystalline material. The crystalline material may be epitaxial crystalline material, recrystallized crystalline material or a combination thereof. The fin, as shown, comprises a coplanar top surface with the dielectric layer.

In other embodiments, the fin structure may comprise a polycrystalline or amorphous material. A polycrystalline or amorphous fin structure may be useful for thin film applications.

In FIG. 10b, a dielectric hard mask 439 is formed on an upper portion of the fin structure 120. In one embodiment, the hard mask is formed by, for example, thermal oxidation. The thickness of the hard mask is sufficient to prevent tunneling effect to isolate a portion of the gate over the top surface of the structure from the top surface of the fin structure. The hard mask, for example, is about 20-50 nm thick. Other thicknesses may also be useful. In one embodiment, the hard mask is formed by oxidizing a top surface of the fin structure and the contact pads. For example, an anneal in an oxidizing ambient is performed. The anneal, for example, is performed at a temperature of about 900° C. in $O_2$ ambient. Other types of hard mask or techniques for forming the hard mask on the top surface of the fin structure are also useful. For example, the hard mask may be formed by depositing a hard mask material on the dielectric layer in which the fin structure includes a recess below the top surface of the dielectric layer. The recess may be formed by SEG or by over-polishing the fin structure. Excess hard mask material may be removed by polishing, leaving the hard mask above the fin structure.

In FIG. 10c, the second dielectric sub-layer 661 is removed, leaving the first dielectric sub-layer 160 on the substrate. Removing the second dielectric sub-layer selective to the first dielectric sub-layer may be achieved by, for example, a wet etch. Other type of techniques, such as RIE, may also be employed to selectively remove the second dielectric sub-layer. An anneal may be optionally performed after removing the second dielectric sub-layer. The anneal, for example, is performed in a hydrogen ($H_2$) ambient to smoothen the fin structure and passivate dangling bonds. Other types of anneals may also be useful.

Gate oxide layers 138a-b are formed on exposed sidewalls of the fin structure, including the contact pads. The gate oxide layers, for example, comprise silicon oxide. In one embodiment, the gate oxide layers are formed by annealing the substrate in an oxidizing ambient, such as $O_2$. This forms thermal silicon oxide layers on the sidewalls of the fin structure. Forming other types of gate oxides or using other techniques to form the gate oxide may also be useful. The thickness of the gate oxide layer may be about, for example, 0.6-3 nm. Other thicknesses for the gate oxide may also be useful.

The process continues to form the device, as described from FIG. 6f and onwards. By providing a hard mask on the top surface of the fin structure, a dual gate finFET is provided. This, for example, advantageously enables designers to have greater latitude in designing the fin structures with different widths and height.

In an alternative embodiment, the process of FIGS. 10a-c may be incorporated in the process for forming embodiments of the device as described in FIGS. 6a-g, 7a-b, 8a-b and 9a-b.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a device comprising:
providing a substrate prepared with a device region which includes a doped isolation well and a dielectric layer over the doped isolation well in the substrate, wherein the dielectric layer includes a second dielectric sub-layer over a first dielectric sub-layer, wherein
the dielectric sub-layers comprise materials which can be removed selectively to each other, and
the first dielectric sub-layer comprises silicon nitride and the second dielectric sub-layer comprises silicon oxide;
forming a fin structure in the dielectric layer after the doped isolation well is provided, wherein forming the fin structure comprises
forming an opening in the dielectric layer to expose a portion of the substrate,
forming an amorphous semiconductor layer over the substrate to fill the opening and cover the dielectric layer,
removing excess amorphous semiconductor layer over the dielectric layer and above the opening to form a planar top surface between the dielectric layer and the amorphous semiconductor layer in the opening, and
performing an anneal to recrystallize the amorphous semiconductor layer in the opening;
removing a portion of the dielectric layer, wherein removing the portion of the dielectric layer leaves an upper portion of the fin structure extending above a top surface of the first dielectric sub-layer;
forming a gate which traverses the fin structure; and
forming doped S/D regions in the fin structure adjacent to the gate.

2. The method of claim 1 wherein the thickness of the first dielectric sub-layer is $H_1$ and the thickness of the second dielectric sub-layer is $H_2$, wherein $H_2$ determines the height of a device in the device region.

3. The method of claim 1 wherein the anneal is performed prior to removing the excess amorphous semiconductor layer.

4. The method of claim 3 wherein the amorphous semiconductor layer comprises amorphous silicon layer.

5. The method of claim 4 wherein performing the anneal comprises annealing the amorphous silicon layer to form a crystalline silicon layer.

6. The method of claim 5 wherein the anneal is performed at a temperature of 600-800° C. for about 10-30 minutes.

7. The method of claim 6 wherein the fin structure includes a first portion and a second portion over the first portion.

8. The method of claim 7 wherein the first portion of the fin structure includes upper and lower first portions.

9. The method of claim 8 wherein:
the lower first portion of the fin structure includes the epitaxial layer, and
the upper first portion and second portion include epitaxial crystalline material, recrystallized crystalline material or a combination thereof.

10. The method of claim 9 further comprises doping the epitaxial layer with first polarity type dopants to form a counter doped region.

11. The method of claim 1 further comprises:
forming a counter doped region, and
wherein the counter doped region and S/D regions include first polarity type dopants and the doped isolation well includes a second polarity type dopants.

12. The method of claim 11 wherein the counter doped region is disposed in an upper portion of the doped isolation well.

13. The method of claim 12 wherein:
the counter doped well is disposed below the fin structure including the S/D regions and a channel between the S/D regions, or
the counter doped well is disposed below the fin structure including the S/D regions but not a channel between the S/D regions.

14. The method of claim 11 wherein the fin structure includes a first portion and a second portion over the first portion.

15. The method of claim 14 wherein the first portion of the fin structure serves as a depletion region separating the counter doped region and S/D regions.

16. A method of forming a device comprising:
providing a substrate prepared with a device region which includes a doped isolation well and a dielectric layer over the doped isolation well in the substrate, wherein the dielectric layer includes a second dielectric sub-layer over a first dielectric sub-layer, wherein
the dielectric sub-layers comprise materials which can be removed selectively to each other, and
the first dielectric sub-layer comprises silicon nitride and the second dielectric sub-laver comprises silicon oxide;
forming a fin structure after the doped isolation well is provided in an opening in the dielectric layer, wherein forming the fin structure comprises
forming an amorphous semiconductor layer over the substrate to fill the opening and cover the dielectric layer,
removing excess amorphous semiconductor layer over the dielectric layer and above the opening to form a planar top surface between the dielectric layer and the amorphous semiconductor layer in the opening, and
performing an anneal to recrystallize the amorphous semiconductor layer in the opening;
removing the second dielectric sub-layer selective to the first dielectric sub-layer to leave a portion of the fin structure extending above a top surface of the first dielectric sub-layer;
forming a gate which traverses the fin structure; and
forming doped S/D regions in the fin structure adjacent to the gate.

17. The method of claim 16 comprises forming a dielectric hard mask on an upper portion of the fin structure.

* * * * *